(12) United States Patent
Taki

(10) Patent No.: US 6,809,876 B2
(45) Date of Patent: Oct. 26, 2004

(54) OPTICAL ELEMENT EQUIPPED WITH LANTHANUM FLUORIDE FILM

(75) Inventor: Yusuke Taki, Yokohama (JP)

(73) Assignee: Nikon Corporation, Tokyo (JP)

( * ) Notice: Subject to any disclaimer, the term of this patent is extended or adjusted under 35 U.S.C. 154(b) by 43 days.

(21) Appl. No.: 10/464,527

(22) Filed: Jun. 19, 2003

(65) Prior Publication Data

US 2003/0227670 A1 Dec. 11, 2003

Related U.S. Application Data

(63) Continuation of application No. PCT/JP02/07266, filed on Jul. 17, 2002.

(30) Foreign Application Priority Data

Jul. 17, 2002 (JP) ........................................ 2001-218045

(51) Int. Cl.⁷ ................................................ G02B 3/00
(52) U.S. Cl. ...................................... 359/649; 359/796
(58) Field of Search ................................ 359/642, 649, 359/650, 651, 796

(56) References Cited

U.S. PATENT DOCUMENTS 5,835,275 A  11/1998  Takahashi et al. .......... 359/629
5,963,365 A  10/1999  Shirai .......................... 359/359
6,030,717 A  * 2/2000  Nakamura et al. .......... 428/699
6,590,702 B1 * 7/2003  Shirai .......................... 359/359
2001/0031543 A1 * 10/2001  Ando et al. ................. 438/485

FOREIGN PATENT DOCUMENTS

| JP | A 9-34706 | 2/1997 |
| JP | A 9-329702 | 12/1997 |
| JP | A 11-142604 | 5/1999 |
| JP | A 2000-89450 | 3/2000 |
| JP | A 2000-131503 | 5/2000 |
| WO | WO 00/58761 | 10/2000 |

* cited by examiner

Primary Examiner—Jordan M. Schwartz
(74) Attorney, Agent, or Firm—Oliff & Berridge, PLC

(57) ABSTRACT

An optical element of the present invention comprises a fluorite substrate 1, and a lanthanum fluoride film 2 formed directly on the substrate 1. The substrate 1, on which the lanthanum fluoride film 2 is formed, has a plane which is a (111) plane or a plane inclined by an angle within ±30 degrees, preferably within 15 degrees from the (111) plane. Therefore, the lanthanum fluoride film undergoes the crystal growth subjected to the C-axis orientation on the optical substrate. Since the lanthanum fluoride film is dense and has a small surface area, it scarcely involves the oxidation and hydroxylation areas as well as the structural defect. Therefore, it is possible to reduce the optical loss of the optical element in the vacuum ultraviolet region.

16 Claims, 22 Drawing Sheets

(a)

(b)

(a) CROSS SECTION IN OBSERVATION
DIRECTION (0 DEGREE)

300nm (b) CROSS SECTION IN OBSERVATION
DIRECTION (90 DEGREES)

300nm (a) APPEARANCE OBSERVED FROM OBLIQUELY UPWARD POSITION IN OBSERVATION DIRECTION (0 DEGREE)

|— 300nm —|

(b) APPEARANCE OBSERVED FROM OBLIQUELY UPWARD POSITION IN OBSERVATION DIRECTION (90 DEGREES)

|— 300nm —|

APPEARANCE OBSERVED FROM
DIRECTLY OVERHEAD POSITION

300nm (a) CROSS SECTION IN OBSERVATION DIRECTION (0 DEGREE)

300nm (b) CROSS SECTION IN OBSERVATION DIRECTION (90 DEGREES)

300nm (a) APPEARANCE OBSERVED
FROM OBLIQUELY UPWARD POSITION
IN OBSERVATION DIRECTION (0 DEGREE)

300nm (b) APPEARANCE OBSERVED
FROM OBLIQUELY UPWARD POSITION
IN OBSERVATION DIRECTION (90 DEGREES)

300nm (a) APPEARANCE OBSERVED FROM DIRECTLY OVERHEAD POSITION (b)

$\theta = 15°$ (a) CROSS SECTION IN OBSERVATION DIRECTION (0 DEGREE)

300nm (b) CROSS SECTION IN OBSERVATION DIRECTION (90 DEGREES)

300nm (a) APPEARANCE OBSERVED FROM OBLIQUELY UPWARD POSITION IN OBSERVATION DIRECTION (0 DEGREE)

300nm (b) APPEARANCE OBSERVED FROM OBLIQUELY UPWARD POSITION IN OBSERVATION DIRECTION (90 DEGREES)

300nm

APPEARANCE OBSERVED FROM
DIRECTLY OVERHEAD POSITION

300nm (a)

(b)

(a)

(b)

(c)

(a)

(b)

In sight of CaF$_2$ (111) plane

● : Ca$^{2+}$ or F$^-$ site 0.3863 nm 0.7187 nm

LaF$_3$ basal plane

● : F$^-$ site

Layer mismatching = 6.98%

OPTICAL ELEMENT EQUIPPED WITH LANTHANUM FLUORIDE FILM

BACKGROUND OF THE INVENTION

CROSS-REFERENCE

This application is a Continuation Application of International Application No. PCT/JP02/07266 which was filed on Jul. 17, 2002 claiming the conventional priority of Japanese patent Application No. 2001-218045 filed on Jul. 18, 2001.

1. Field of the Invention

The present invention relates to an optical element having a multilayer film which minimally absorbs the light in the vacuum ultraviolet region and to an exposure apparatus provided with the optical element.

2. Description of the Related Art

The fluoride material has such an excellent optical characteristic that the material is transparent over a wide light wavelength range from the infrared to the vacuum ultraviolet region. In particular, almost all of oxide materials are opaque at wavelengths of not more than 180 nm, while a large number of fluoride materials are transparent. Therefore, the fluoride is necessary and indispensable especially for optical thin films and optical element materials to be used for the vacuum ultraviolet region.

In recent years, the high integration and the high densification are progressively advanced for the semiconductor integrated circuit. In order that the line width of the semiconductor integrated circuit is thinned and the pattern is made to be further minute, it is demanded to further improve the photolithography resolution of the reduction projection exposure apparatus for producing the semiconductor circuit. In order to improve the photolithography resolution of the reduction projection exposure apparatus, the wavelength of the exposure light source has been hitherto shortened to the g-ray, the i-ray (wavelength: 365 nm), and the KrF excimer laser (wavelength: 248 nm). It is inevitable that the wavelength will be progressively shortened to the ArF laser (wavelength: 193 nm) and the $F_2$ laser (wavelength: 157 nm) in future. The fluoride, which is also transparent with respect to the exposure light beam having the shortened wavelength, is used for the optical element such as lenses and prisms and the optical thin film such as antireflection films and polarization films with which the surface of the optical element is coated.

As much as several tens of optical elements, which are directed to a variety of ways of use, are arranged between the laser light source and the wafer on which the semiconductor circuit is exposed in the reduction projection exposure apparatus as described above. The surfaces of the optical elements are coated with fluoride thin films depending on their purposes respectively. It is a matter of course that the materials for the optical elements themselves and the fluoride thin films absorb the light. Therefore, the amount of light, which finally arrives at the wafer surface, is considerably decreased. In order to improve the exposure performance and the productivity, it is necessary that the decrease in light amount is minimized as far as possible.

As a result of diligent researches and developments for many years, the defect and the content of impurity, which cause the light absorption, are suppressed as far as possible in relation to the optical element materials themselves. Owing to the advancement of the polishing technique, the scattering on the element surface is lowered as well. On the other hand, the optical thin film has been hitherto formed by means of various PVD methods including, for example, the vacuum deposition based on the resistance heating and the electron beam dissolution, the vacuum deposition combined with the ion assist, the ion plating, the sputtering, and the ion beam sputtering.

Fluorine is deficient as compared with the stoichiometric composition in the fluoride thin film produced by any film formation technique other than the resistance heating type vacuum deposition method. As a result, the absorption edge wavelength is shifted toward the long wavelength side as compared with the ideal crystal, and any absorption band also appears due to the defect and the impurity. Therefore, in such a fluoride thin film, the light absorption is increased in the vacuum ultraviolet region.

That is, in the case of the electron beam dissolution type vacuum deposition, the deposition material of fluoride is evaporated by using the electron radiation energy. However, the separation is caused by the energy between the fluorine atom and the metal atom in a certain proportion. Therefore, the fluorine deficiency occurs in the vapor deposition film. In the case of the ion assist vacuum deposition and the ion plating, the thin film surface, at which the growth is continued on the substrate, undergoes the ion beam radiation and the plasma radiation. As a result, the fluorine divergence, which is caused by the collision of charged particles on the growth film surface, also occurs in addition to the fluorine divergence caused on the side of the vapor deposition material. Further, in the case of the sputtering and the ion beam sputtering, when the fluoride target is subjected to the sputtering by means of the ion impact, only the light fluorine atoms are selectively subjected to the sputtering due to the selective sputtering phenomenon. As a result, the fluorine deficiency occurs on the target surface.

Therefore, in the case of the respective film formation processes other than the resistance heating type vacuum deposition method, any fluorine-based gas is introduced into the film formation vessel during the film formation in order to supplement the fluorine deficiency of the deposited film. However, it is complicated to control the reaction, and a film, which is based on the stoichiometric composition, is not necessarily obtained with ease.

On the contrary, in the case of the resistance heating type vacuum deposition method, fluoride crystal grains, which serve as the raw material, are placed on a vapor deposition boat made of a high melting point metal such as molybdenum, tungsten, and tantalum, and the vapor deposition boat is heated by applying the electric power to evaporate the raw material fluoride crystals. The fluoride, which is evaporated in accordance with the reversible physical change of the evaporation caused by the heating, does not cause the fluorine deficiency. The evaporated fluoride is allowed to fly onto a substrate having a relatively low temperature installed at a position opposed to the vapor deposition boat. The fluoride is deposited and solidified on the substrate while effecting the adsorption and the desorption, and thus the fluoride is grown as a thin film. The fluoride thin film, which is formed on the substrate as described above, hardly causes the fluorine deficiency.

As described above, the fluoride thin film, which is produced by the resistance heating type vacuum deposition method, is more excellent than the fluoride thin films produced by the other film formation techniques in that the fluorine deficiency is not caused and the fluoride thin film has the stoichiometric composition. On the other hand, the fluoride thin film has the columnar or prism-shaped structure. Therefore, the fluoride thin film has such a drawback that the film is porous and it has a large surface area, as compared with the single crystals and the bulk polycrystals as well as the films produced by the other film formation methods.

This drawback results from the fact that the substrate (fluoride optical element) has the low temperature. However, if the substrate is heated to a high temperature of several hundred degrees centigrade or more, the optical constant of the optical element itself is changed. Further, the shape of the lens surface, which has been strictly finished, is also changed, and the intended function as the optical element is consequently lost. Therefore, the substrate temperature is suppressed to be low.

If the substrate temperature is relatively high after the particles evaporated from the evaporation boat are allowed to fly onto the substrate surface to effect the adsorption, then the structure of the formed film is consequently dense, and the structural irregularity is scarcely caused as well, because the adsorbed particles receive the energy sufficient to make the movement on the surface to stable positions so that the surface becomes smooth. However, when the substrate temperature is relatively low, then it is impossible for the adsorbed particles to obtain the energy sufficient to make the movement on the surface, and the particles are immediately solidified after the adsorption. Therefore, the structure of the consequently formed film is a coarse columnar-shaped structure, and the structural irregularity is frequently caused as well.

Water and various hydrocarbons are adsorbed on the surface of the optical element taken out to the atmospheric air after the completion of the film formation. In the case of the single crystals and the bulk polycrystals, the mass of the adsorbed matter is reasonably decreased, because the surface area is small. However, the film, which is produced by the resistance heating type vacuum deposition method, has the columnar-shaped structure, the film is porous, and the film has a large surface area. Therefore, the amount of adsorption of water and hydrocarbons is far and away increased. Water and hydrocarbons absorb the vacuum ultraviolet light. Therefore, the transmittance is deteriorated in the vacuum ultraviolet region, because the amount of adsorbed matters is increased and the light absorption is increased as the surface area of the optical thin film for the vacuum ultraviolet light is increased.

Usually, the optical thin film is formed by alternately laminating high refractive index films and low refractive index films. As for the film materials preferred for the vacuum ultraviolet light, $LaF_3$ is exemplified for the high refractive index film, and $MgF_2$ is exemplified for the low refractive index film. The high refractive index film herein refers to the film composed of the material having a refractive index higher than the refractive index of the substrate. The low refractive index film herein refers to the film composed of the material having a refractive index lower than the refractive index of the substrate. The middle (intermediate) refractive index film refers to the film composed of the material having a refractive index between those of the high refractive index film and the low refractive index film. Until now, the applicant has made diligent researches about the reaction between the fluoride material and water. As a result, the applicant has found out the following fact. That is, water makes only the physical adsorption to $MgF_2$, and it does not chemically react therewith. However, water makes not only the physical adsorption to $LaF_3$ but also water causes the chemical reaction therewith to produce La—OH and La—O bonds on the surface of $LaF_3$ exposed to the atmospheric air. That is, the surface of $LaF_3$ exposed to the atmospheric air is hydroxylated and oxidized. In other words, the $LaF_3$ film approximately has the stoichiometric composition of La:F=1:3 in relation to the entire film. However, the fluorine deficiency occurs in the vicinity of the surface exposed to the atmospheric air as a result of the chemical reaction with water in the atmospheric air to cause the oxidation and the hydroxylation. The vacuum ultraviolet light is absorbed by the oxidation area and the hydroxylation area, and the vacuum ultraviolet light is not transmitted therethrough. Therefore, as for the $LaF_3$ film, the physically adsorbed water not only absorbs the vacuum ultraviolet light, but also the oxidation and hydroxylation areas, which are disposed on the surface exposed to the atmospheric air, absorb the vacuum ultraviolet light. Therefore, the optical loss is extremely large as compared with $MgF_2$. That is, the optical loss of the optical thin film for the vacuum ultraviolet light composed of the alternate laminate of $MgF_2$ and $LaF_3$ is determined by the optical loss of $LaF_3$ film.

As having been already discussed, the $LaF_3$ film, which is obtained by the resistance heating vapor deposition, provides the porous columnar-shaped structure having the large surface area. Therefore, the amount of physically adsorbed water as well as the hydroxylation and oxidation areas is overwhelmingly increased as compared with the $LaF_3$ of the single crystals and the bulk polycrystals as well as the $LaF_3$ film produced by any other film formation method. This exactly means the fact that the amount of absorption of the vacuum ultraviolet light is increased.

The optical thin film, which includes the $LaF_3$ film having the large light absorption as described above, has been carried on the exposure apparatus for the vacuum ultraviolet light. The respective surfaces of the optical elements are coated with the optical thin films. That is, the number of the coating surfaces is twice the number of the optical elements. Therefore, the light, which arrives at the wafer surface after passing through several tens of coatings of the optical thin films each having the large optical loss, has a light amount which is about several % of the original light amount of the light source and which is extremely low. In other words, the light absorption of the porous $LaF_3$ film having the large surface area has determined the exposure characteristics.

The laser durability of the optical thin film as described above has not been so high as expected, due to the hydroxylation and oxidation areas existing on the $LaF_3$ surface. Therefore, the frequency of the exchange of optical element parts has been inevitably increased. In other words, the $LaF_3$ film, which is porous and which has the large surface area, has affected the throughput of the exposure apparatus.

SUMMARY OF THE INVENTION

An object of the present invention is to provide an optical element having a multilayer film which minimally absorbs light in the vacuum ultraviolet region. Another object of the present invention is to provide an exposure apparatus provided with the optical element.

According to a first aspect of the present invention, there is provided an optical element comprising an optical substrate which is formed of one of calcium fluoride, barium fluoride, and strontium fluoride; and a lanthanum fluoride film which is formed directly on the optical substrate. The crystal of the lanthanum fluoride film may be grown in C-axis orientation on the optical substrate. In order to reliably allow the lanthanum fluoride film to undergo the crystal growth in the C-axis orientation on the optical substrate, it is desirable that a plane (surface) of the optical substrate, on which the lanthanum fluoride film is formed, is a (111) plane or a plane inclined by an angle within ±30 degrees, more preferably within 15 degrees from the (111) plane.

According to a second aspect of the present invention, there is provided an optical element comprising an optical substrate; an underlayer which is formed of one of calcium fluoride, barium fluoride, and strontium fluoride; and a lanthanum fluoride film which is formed directly on the underlayer. When a plane of the underlayer, on which the lanthanum fluoride film is formed, is a (111) plane or a plane inclined by an angle within ±30 degrees from the (111) plane, the crystal of lanthanum fluoride film may be grown in C-axis orientation on the underlayer. Since the lanthanum fluoride film is dense and has a small surface area, it scarcely involves the oxidation and hydroxylation areas as well as the structural defect. Accordingly, it is possible to reduce the optical loss of the optical element in the vacuum ultraviolet region. Therefore, the optical elements according to the first and second aspects of the present invention are preferably usable as an optical element equipped with an antireflection film in the vacuum ultraviolet region.

According to a third aspect of the present invention, there is provided an exposure apparatus for exposing a substrate with an image of a pattern formed on a mask, the exposure apparatus comprising an illumination optical system which illuminates the mask with a vacuum ultraviolet light beam; and a projection optical system which includes the optical element according to the first or second aspect and which projects the image of the pattern onto the substrate. According to a fourth aspect of the present invention, there is provided an exposure apparatus for exposing a substrate with an image of a pattern formed on a mask, the exposure apparatus comprising an illumination optical system which includes the optical element according to the first or second aspect and which illuminates the mask with a vacuum ultraviolet light beam; and a projection optical system which projects the image of the pattern onto the substrate. According to the exposure apparatuses in accordance with the third and fourth aspects, the illumination optical system or the projection optical system includes the optical element according to the present invention. Therefore, it is possible to decrease the optical loss in the illumination optical system or the projection optical system with respect to the exposure light beam, especially with respect to the light beam in the vacuum ultraviolet region. Further, it is possible to efficiently introduce the exposure light beam onto the substrate. As a result, it is possible to improve the throughput of the exposure apparatus in which the operation of the exposure apparatus would be otherwise interrupted or restricted due to the maintenance including, for example, the cleaning and the exchange of the optical element disposed in the illumination optical system or the projection optical system.

According to a fifth aspect of the present invention, there is provided a method for producing an optical element, comprising preparing an optical substrate which is formed of one of calcium fluoride, barium fluoride, and strontium fluoride and which plane is a (111) plane or a plane inclined by an angle within ±30 degrees from the (111) plane; and forming a lanthanum fluoride film on the plane of the optical substrate. According to a sixth aspect of the present invention, there is provided a method for producing an optical element, comprising forming an underlayer composed of one of calcium fluoride, barium fluoride, and strontium fluoride on an optical substrate while heating the optical substrate so that a (111) plane or a plane inclined by an angle within ±30 degrees from the (111) plane appears; and forming a lanthanum fluoride film on the underlayer. According to the production methods in accordance with the fifth and the sixth aspects, the lanthanum fluoride film undergoes crystal growth while being subjected to C-axis orientation from the (111) plane or the plane inclined by the angle within ±30 degrees from the (111) plane of calcium fluoride, barium fluoride, or strontium fluoride. Accordingly, it is possible to obtain the lanthanum fluoride film which is dense, which has a small surface area, and which scarcely involves the oxidation and hydroxylation areas as well as the structural defect. Therefore, it is possible to obtain the optical element in which the optical loss is reduced in the vacuum ultraviolet region.

BRIEF DESCRIPTION OF THE DRAWINGS

FIG. 3 shows SEM photographs illustrating cross sections of an $LaF_3$ film formed on a (111) plane of fluorite, wherein FIG. 3(a) shows the cross section observed in the direction of 0 degree, and FIG. 3(b) shows the cross section observed in the direction of 90 degrees.

FIG. 4 shows SEM photographs obtained by photographing the $LaF_3$ film formed on the (111) plane of fluorite from obliquely upward positions, wherein FIG. 4(a) shows a situation observed in the direction of 0 degree, and FIG. 4(b) shows a situation observed in the direction of 90 degrees.

FIG. 6 shows SEM photographs illustrating cross sections of an $LaF_3$ film formed on a plane inclined by 15 degrees from a (111) plane of fluorite, wherein FIG. 6(a) shows the cross section observed in the direction of 0 degree, and FIG. 6(b) shows the cross section observed in the direction of 90 degrees.

FIG. 7 shows SEM photographs obtained by photographing the $LaF_3$ film formed on the plane inclined by 15 degrees from the (111) plane of fluorite from obliquely upward positions, wherein FIG. 7(a) shows a situation observed in the direction of 0 degree, and FIG. 7(b) shows a situation observed in the direction of 90 degrees.

FIG. 9 shows SEM photographs illustrating cross sections of an $LaF_3$ film formed on quartz, wherein FIG. 9(a) shows the cross section observed in the direction of 0 degree, and FIG. 9(b) shows the cross section observed in the direction of 90 degrees.

FIG. 10 shows SEM photographs obtained by photographing the $LaF_3$ film formed on quartz from obliquely upward positions, wherein FIG. 10(a) shows a situation observed in the direction of 0 degree, and FIG. 10(b) shows a situation observed in the direction of 90 degrees.

FIG. 20 shows cross-sectional structures of optical elements according to applied embodiments, wherein FIG. 20(a) shows the structure comprising a $CaF_2$ film, an $LaF_3$ film, and an $MgF_2$ film formed on a quartz glass substrate respectively, and FIG. 20(b) shows the structure comprising an $MgF_2$ film, a $CaF_2$ film, and an $LaF_3$ film formed on a quartz glass substrate respectively.

DESCRIPTION OF THE PREFERRED
EMBODIMENTS OF THE INVENTION

Figure 1:
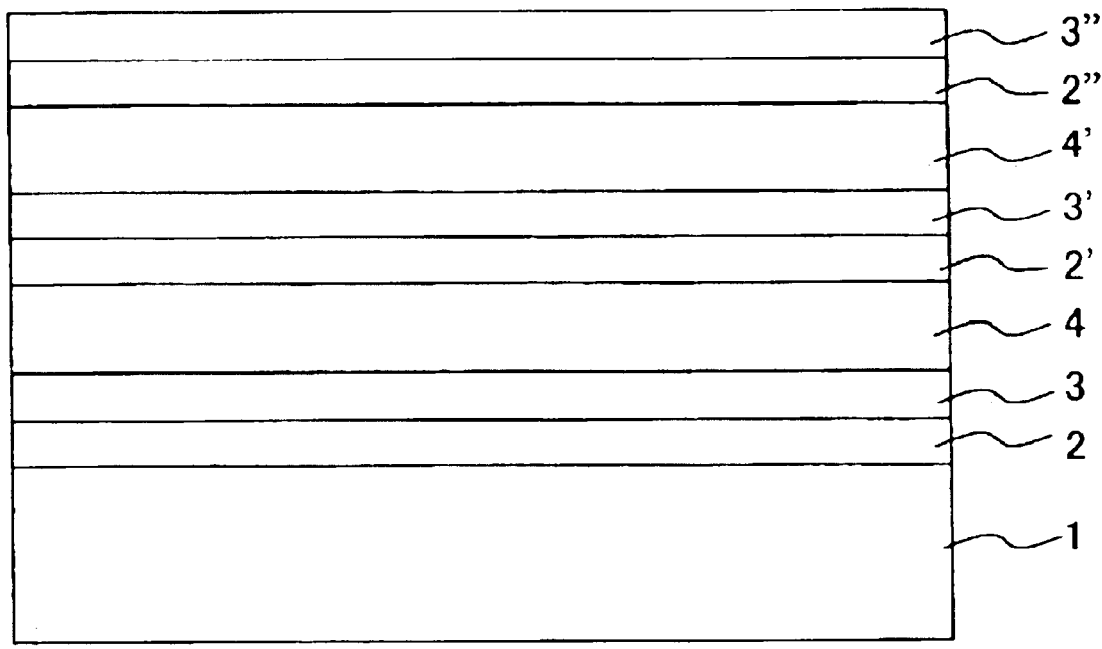
FIG. 1 shows a sectional view illustrating a specified embodiment of the optical element of the present invention.

An explanation will be made below with reference to the drawings about an optical element having an antireflection film composed of a fluoride multilayer film according to an embodiment of the present invention. FIG. 1 shows a structure of the optical element having the fluoride multilayer film according to the embodiment.

With reference to FIG. 1, a lanthanum fluoride ($LaF_3$) thin film 2 is formed on a fluorite substrate 1 by means of, for example, the resistance heating type vacuum deposition method. In this arrangement, the lanthanum fluoride ($LaF_3$) thin film 2 has such a structure that the lanthanum fluoride ($LaF_3$) thin film 2 is laminated by utilizing the crystalline orientation on a specified crystal plane of the fluorite substrate 1, for example, on the (111) plane. The crystalline orientation herein means the fact that the deposited material (film) is subjected to the crystal growth in accordance with the crystalline structure of the substrate or the film which serves as the underlying base. In this arrangement, the lanthanum fluoride is subjected to the crystal growth while undergoing the C-axis orientation from the (111) plane of the substrate 1. The X-ray diffraction makes it possible to confirm whether or not the C-axis orientation is effected. For example, when any diffraction line, which belongs those in directions other than the [00L] direction, is not substantially observed, it is affirmed that the C-axis orientation is effected. It is also allowable that portions, which are not subjected to the C-axis orientation, are contained in slight amounts. For example, it is allowable that the half value width of the diffraction line from the (002) plane is less than 5 degrees in the θ scan. When the half value width is less than 2 degrees, it is affirmed that the lanthanum fluoride film is subjected to the C-axis orientation to such an extent that the effect of the present invention is obtained.

A magnesium fluoride ($MgF_2$) thin film 3 and a calcium fluoride ($CaF_2$) thin film 4 are formed on the lanthanum fluoride ($LaF_3$) thin film 2 by means of the resistance heating type vacuum deposition method respectively.

Further, a lanthanum fluoride ($LaF_3$) thin film 2' is formed on the calcium fluoride ($CaF_2$) thin film 4 by means of the resistance heating type vacuum deposition method. In this arrangement, the lanthanum fluoride ($LaF_3$) thin film 2' is formed by utilizing the crystalline orientation on a specified crystal plane of the calcium fluoride ($CaF_2$) thin film 4.

A magnesium fluoride ($MgF_2$) thin film 3', a calcium fluoride ($CaF_4$) thin film 4', a lanthanum fluoride ($LaF_3$) thin film 2", and a magnesium fluoride ($MgF_2$) thin film 3" are successively formed on the lanthanum fluoride ($LaF_3$) thin film 2' by means of the resistance heating type vacuum deposition method. The lanthanum fluoride ($LaF_3$) thin film 21" is laminated on a specified crystal plane of the calcium fluoride ($CaF_2$) thin film 4' by utilizing the crystalline orientation.

In the optical element according to this embodiment, the fluorite is used as the substrate, and the calcium fluoride ($CaF_2$) thin film is used as the underlying base film or underfilm. The lanthanum fluoride ($LaF_3$) thin film, which is dense equivalently to the bulk and which has a small surface area, is laminated by utilizing the crystalline orientation. The calcium fluoride ($CaF_2$) thin film, which is inserted into the multilayer film, does not exert any harmful influence at all on the characteristics of the completed antireflection film, because the calcium fluoride ($CaF_2$) thin film is composed of a middle refractive index material which is the same substance as the fluorite to serve as the substrate.

The lanthanum fluoride ($LaF_3$) thin film, which constitutes the multilayer film of the optical element, is dense equivalently to the bulk, and it has the small surface area. Therefore, the lanthanum fluoride ($LaF_3$) thin film scarcely involves the oxidation and hydroxylation areas and the structural defect. It is possible to decrease the optical loss in the vacuum ultraviolet region.

In the optical element according to this embodiment, the lanthanum fluoride ($LaF_3$) thin films 2, 2', 2" are formed by utilizing the crystalline orientation on the specified crystal plane of the fluorite substrate 1 and on the specified crystal planes of the calcium fluoride ($CaF_2$) thin films 4, 4'. However, the lanthanum fluoride ($LaF_3$) thin films 2, 2', 2" may be formed by utilizing the crystalline orientation on a plane inclined by an angle within ±30 degrees from the specified crystal plane of the fluorite substrate 1 and on planes inclined by an angle within ±30 degrees from the specified crystal planes of the calcium fluoride ($CaF_2$) thin films 4, 4'.

In the optical element according to the embodiment described above, the fluorite is used as the substrate, and the calcium fluoride ($CaF_2$) thin film is used as the underlying base film so that the lanthanum fluoride ($LaF_3$) thin film is formed. Alternatively, barium fluoride ($BaF_2$) may be used as the substrate, and a barium fluoride ($BaF_2$) thin film may be used as the underlying base film so that the lanthanum fluoride (LaF$_3$) thin film may be formed. Further alternatively, strontium fluoride (SrF$_2$) may be used as the substrate, and a strontium fluoride (SrF$_2$) thin film may be used as the underlying base film so that the lanthanum fluoride (LaF$_3$) thin film may be formed. Also in these arrangements, the lanthanum fluoride (LaF$_3$) thin film is subjected to the crystal growth while undergoing the specified orientation from the substrate or the underlying base film of BaF$_2$ or SrF$_2$. Therefore, the film, which is dense equivalently to the bulk and which has a small surface area, is formed. The film scarcely involves the oxidation and/or hydroxylation area as well as the structural defect. It is possible to decrease the optical loss of the antireflection film in the vacuum ultraviolet region.

Figure 2:
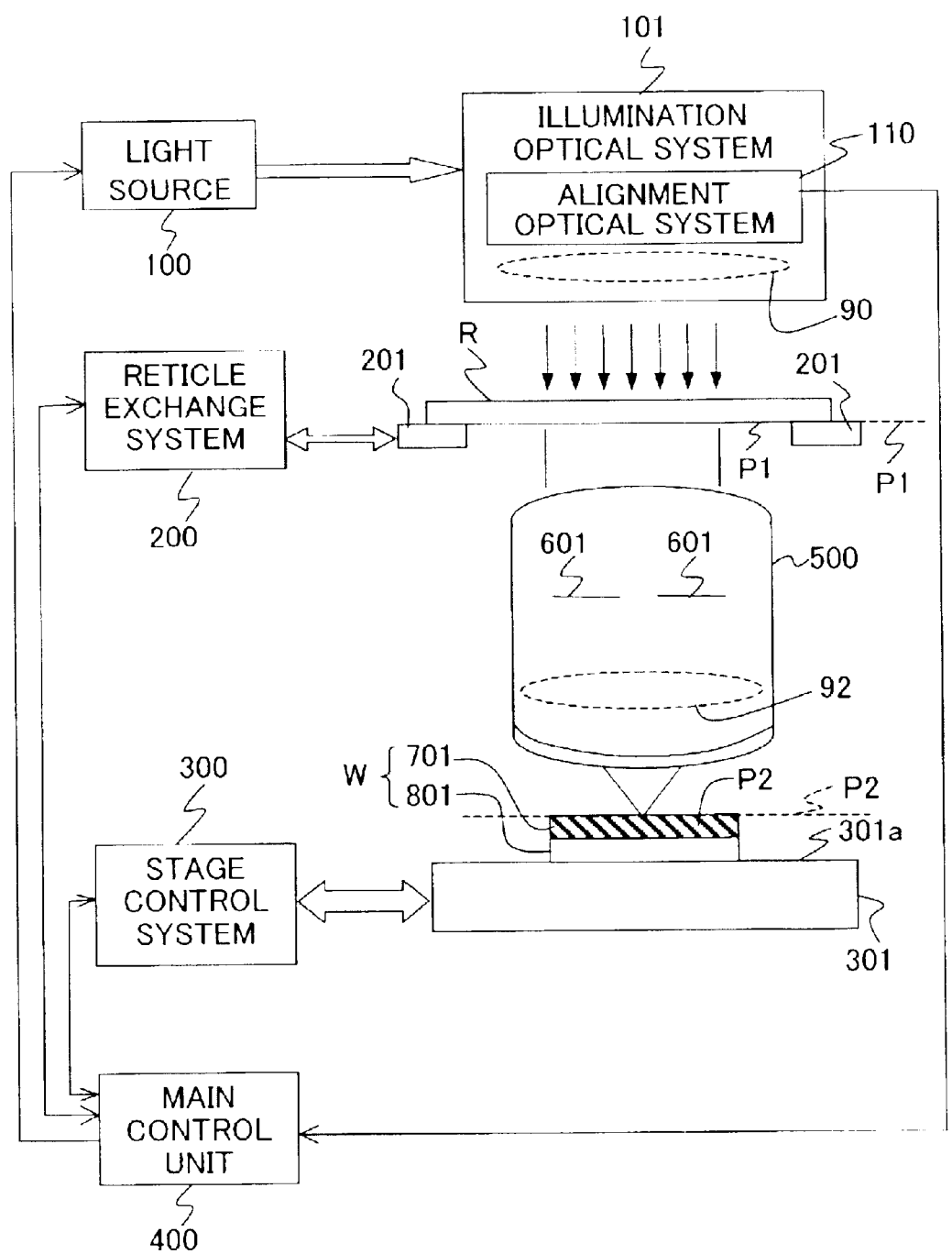
FIG. 2 schematically shows a basic structure of an exposure apparatus of the present invention.

Next, an exposure apparatus according to an embodiment of the present invention will be explained by way of example. FIG. 2 shows a basic structure of the projection exposure apparatus such as those called "stepper" based on the use of the optical element having the fluoride optical thin film described above, i.e., the optical element shown in FIG. 1. The apparatus projects an image of a pattern on a reticle onto a wafer coated with a photoresist.

As shown in FIG. 2, the exposure apparatus comprises at least a wafer stage 301 on which a substrate W applied with a photosensitizer is placeable on a surface 301a, an illumination optical system 101 which radiates a vacuum ultraviolet light beam having a wavelength, for example, 157 to 193 nm prepared as the exposure light beam to transfer the pattern on the reticle (mask) R onto the substrate W, a light source 100 which supplies the exposure light beam to the illumination optical system 101, a projection optical system 500 which is disposed between a first surface P1 (object plane) on which the reticle R is arranged in order to project the image of the pattern on the reticle R onto the substrate W and a second surface (image plane) which coincides with the surface of the substrate W.

The illumination optical system 101 also includes an alignment optical system 110 for regulating the relative position between the reticle R and the wafer W. The reticle R is arranged on a reticle stage 201 which is movable in parallel to the surface of the wafer stage 301. A reticle exchange system 200 exchanges and transports the reticle (mask R) set on the reticle stage 201. The reticle exchange system 200 includes a stage driver for moving the reticle stage 201 in parallel to the surface 301a of the wafer stage 301. The projection optical system 500 includes an alignment optical system which is applicable to the scanning type exposure apparatus. The light source 100, the reticle exchange system 200, and the stage control system 300 are controlled by a main control unit 400.

The exposure apparatus uses the optical element having the fluoride optical thin film described above. Specifically, the exposure apparatus shown in FIG. 2 is provided with the optical element (optical lens) according to the present invention for an optical lens 90 of the illumination optical system 101 and/or an optical lens 92 of the projection optical system 500.

The exposure apparatus includes the optical element having the fluoride optical thin film in the projection optical system 500 and/or the illumination optical system 101. Therefore, the vacuum ultraviolet light beam, which serves as the exposure light beam supplied from the light source 100, can be efficiently introduced onto the substrate.

First Embodiment

Figure 17:
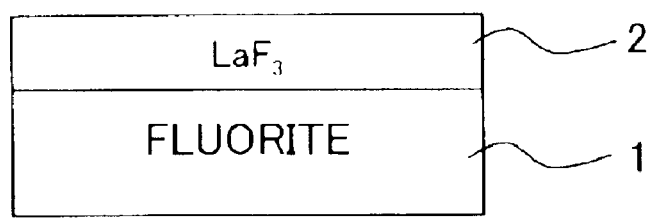
FIG. 17(a) shows a sectional view of a sample manufactured in a first embodiment.
FIG. 17(b) shows a sectional view of a sample having the laminated structure I manufactured in a third embodiment.
Figure 17:
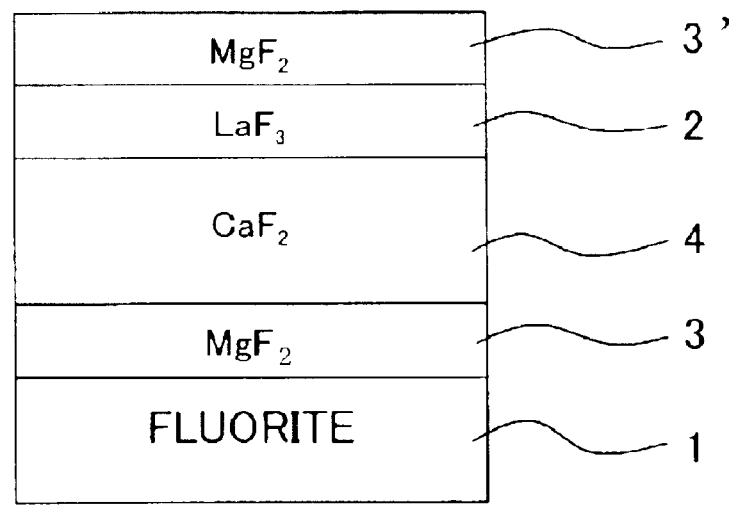

A fluorite (CaF$_2$) single crystal substrate was prepared as a material for an optical element for the vacuum ultraviolet light. At first, the X-ray diffraction was used to measure the direction of the fluorite single crystal substrate in which the (111) crystal plane is positioned. The substrate was cleaved in parallel to the measured (111) crystal plane to expose the (111) crystal plane. Subsequently, an LaF$_3$ film was formed to have a film thickness of 500 nm on the exposed (111) crystal plane by means of the resistance heating type vacuum deposition method as described below. Crystal grains of lanthanum fluoride, which were used as a raw material, were introduced into a vapor deposition boat made of molybdenum. The substrate, on which the (111) crystal plane was exposed, was arranged at a position opposed to the vapor deposition boat. Subsequently, the raw material fluoride crystals were evaporated by applying the electricity and heating the vapor deposition boat while heating the substrate at 250° C. The evaporated lanthanum fluoride was deposited on the (111) crystal plane of the substrate. Thus, a sample was obtained, in which the LaF$_3$ film was formed on the fluorite substrate as shown in FIG. 17(a).

Subsequently, the X-ray diffraction analysis was performed for this sample. In the X-ray diffraction 2θ/θ scan, the diffraction line from the (nnn) plane was obtained as resulting from the (111) plane of the single crystal CaF$_2$ as the underlying base, and the diffraction line from each (002), (004), . . . , (00L) plane was obtained as resulting from LaF$_3$. The diffraction line resulting from LaF$_3$ was based on only the (00L) plane. Therefore, it was revealed that the LaF$_3$ film was subjected to the C-axis orientation with respect to the fluorite substrate surface. Subsequently, the X-ray diffraction θ scan was used to measure the diffraction line of the LaF$_3$ (002) plane. As a result, it was revealed that the half value width of the diffraction line was less than 0.5 degree, and the diffraction line was extremely sharp. Any diffraction line, which was in any direction other than the [00L] direction, was not observed. In this embodiment, it was revealed that the LaF$_3$ film, in which the interplanar spacing was adjusted in the [00L] direction, was successfully produced although the film was formed at the low temperature, i.e., the substrate temperature was not more than 300° C.

Figure 21:
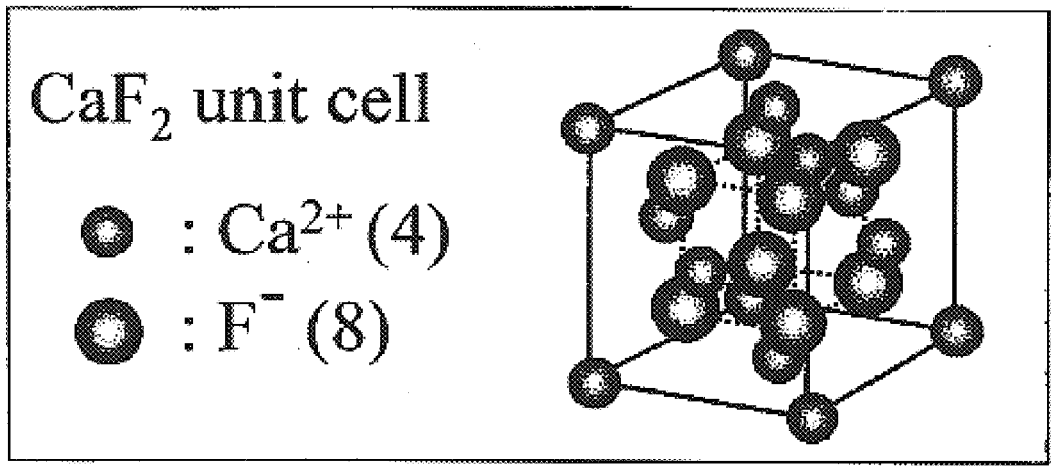
FIG. 21 conceptually explains the cubic system fluorite type structure (Fm3m).
Figure 22:
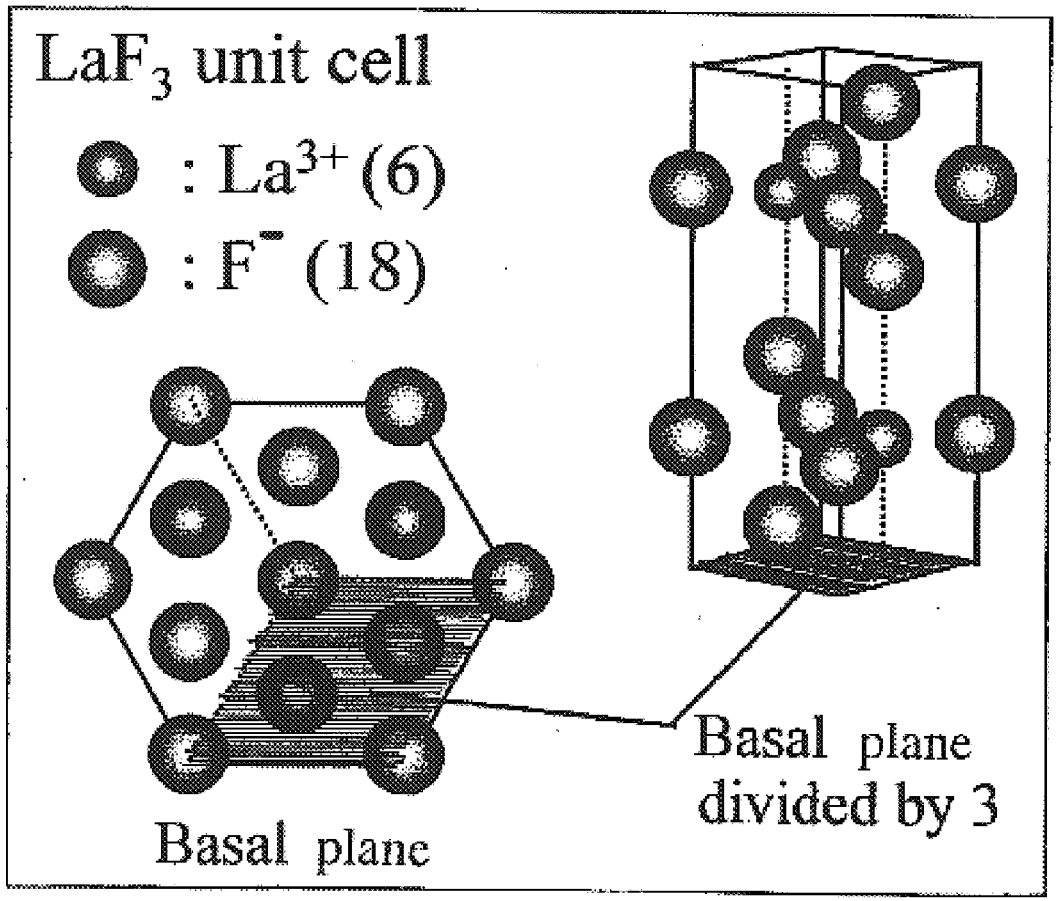
FIG. 22 conceptually explains the crystalline structure of $LaF_3$.

The crystalline structure of fluorite is the cubic system fluorite type structure (Fm3m) as shown in FIG. 21, and the lattice constant is represented as a=0.5463 nm. On the other hand, it is known that the crystalline structure of LaF$_3$ is any one of the hexagonal system Na$_3$As (P6$_3$/mmc) structure as shown in FIG. 22 and the trigonal system (P-3cl) structure. Both of the hexagonal crystals and the trigonal crystals belong to the hexagonal system. The lattice constants are represented as a=0.7187 nm and c=0.7350 nm.

Figure 23:
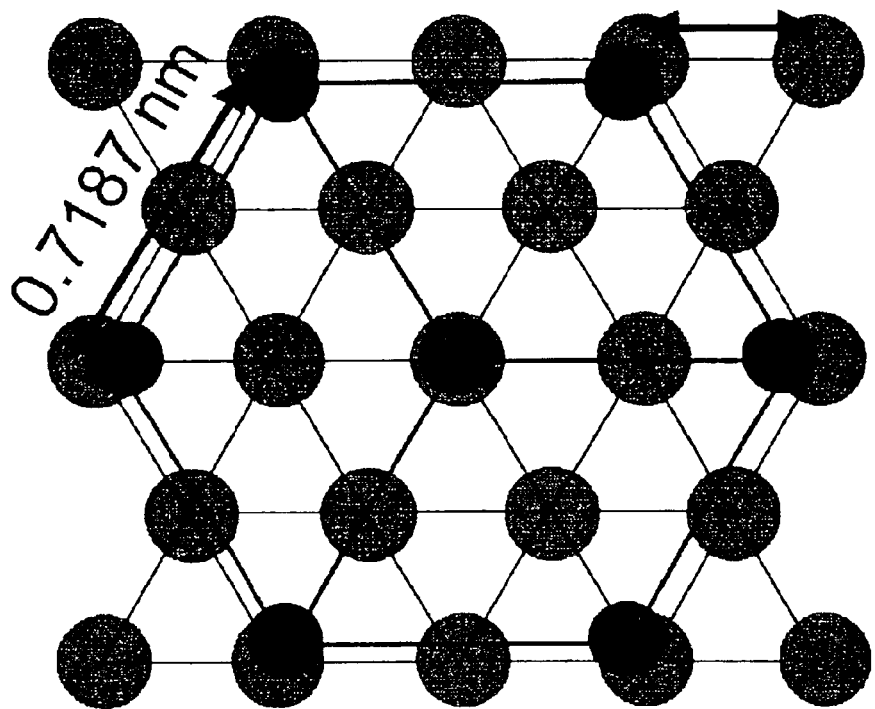
FIG. 23 conceptually illustrates a sample comprising $LaF_3$ formed on fluorite, as viewed in the [111] direction.

When the fluorite is viewed in the [111] direction, the Ca atom layers composed of the regular triangular units and the F atom layers composed of the regular triangular units as well are alternately laminated as shown in FIG. 23. In this structure, the Ca—Ca interatomic distance, which is one side of the regular triangle, is 0.3863 nm, and the F—F interatomic distance is also 0.3863 nm. The Ca atoms and the F atoms are viewed in a mutually overlapped manner when they are viewed in the [111] direction. Therefore, they are represented by identical gray circles in FIG. 23. When LaF$_3$ is viewed in the [00L] direction, the F atoms are coordinated at the center and the respective six apexes of the basal plane (regular hexagon). That is, the basal plane is constructed by gathering the six regular hexagons with the F atoms arranged at the apexes. In this structure, the F—F interatomic distance is 0.7187 nm.

As appreciated from FIG. 23, when LaF$_3$ is oriented and grown in parallel to the (00L) plane on the (111) crystal plane of fluorite, the regular hexagon, which has the length of one side of 0.7187 nm with the F atoms arranged at the apexes, is placed on the plane which is constituted by the regular triangles each having the length of one side of 0.3863 nm with the Ca atoms or the F atoms arranged at the apexes. In this structure, the degree of lattice mismatching is:

$$0.3863\ nm \times 2 = 0.7726\ nm$$

$$[(0.7726\ nm - 0.7187\ nm)/0.7726\ nm] = 6.98\%.$$

The value is within a range in which the lattice is generally capable of matching. As described above, it is confirmed experimentally and theoretically that $LaF_3$ is subjected to the C-axis orientation growth with respect to the (111) crystal plane of the fluorite.

Comparative Example 1A

An $LaF_3$ film was formed on a quartz glass substrate in the same manner as in the first embodiment except that the quartz glass substrate was used in place of the fluorite substrate. A sample thus obtained was analyzed by means of the X-ray diffraction. In the X-ray diffraction $2\theta/\theta$ scan, diffraction lines corresponding to the (111), (112), (211), (300), (113), (302) planes other than (00L) were obtained as diffraction lines resulting from $LaF_3$. According to this fact, it was confirmed that the $LaF_3$ film was a non-oriented crystalline film, i.e., a polycrystalline film. The half value width of the diffraction line of the (002) plane was 7.5 degrees.

Comparative Example 1B

An $LaF_3$ film was formed by means of the resistance heating type vacuum deposition method in the same manner as in the first embodiment except that an $MgF_2$ film was vapor-deposited to have an optical film thickness of $\lambda/4$ ($\lambda$=157 nm) on the fluorite single crystal substrate on which the (111) crystal plane was exposed, before forming the $LaF_3$ film. The X-ray diffraction analysis was performed for an obtained sample. In the X-ray diffraction $2\theta/\theta$ scan, diffraction lines corresponding to the (111), (112), (211), (300), (113), (302) planes other than (00L) were obtained as diffraction lines resulting from $LaF_3$. According to this result, it was confirmed that the $LaF_3$ film was a non-oriented crystalline film, i.e., a polycrystalline film. The half value width of the diffraction line of the (002) plane of the $LaF_3$ film was 8.5 degrees.

Second Embodiment

A sample was manufactured, in which an $LaF_3$ film was formed on a fluorite single crystal substrate in the same manner as in the first embodiment except that a plane inclined by 15 degrees from the (111) crystal plane of the fluorite single crystal substrate was exposed by the cleavage, and the $LaF_3$ film was formed thereon. The X-ray diffraction analysis was performed for this sample. As a result, when the film formation plane of the fluorite as the underlying base was inclined by 15 degrees from the (111) plane, the (00L) plane of the $LaF_3$ film grown on the film formation plane was also precisely inclined by 15 degrees. In other words, the $LaF_3$ film was subjected to the C-axis orientation in the direction inclined by 15 degrees from the film formation plane. That is, it is appreciated that the $LaF_3$ film is progressively grown in accordance with the crystalline orientation of $CaF_2$ which serves as the underlying base in every sense not in accordance with the film formation plane (substrate surface).

Comparative Example 2

A sample was manufactured, in which an $LaF_3$ film was formed on a fluorite single crystal substrate in the same manner as in the second embodiment except that a plane inclined by 50 degrees from the (111) crystal plane of the fluorite single crystal substrate was exposed.

Observation with SEM Photographs

Next, SEM observation was carried out for the $LaF_3$ films of the sample obtained in the first embodiment (sample in which the $LaF_3$ film was formed on the fluorite (111) plane), the sample obtained in the second embodiment (sample in which the $LaF_3$ film was formed on the plane inclined by 15 degrees from the fluorite (111) plane), and the sample obtained in the Comparative Example 1A (sample in which the $LaF_3$ film was formed on the quartz glass) respectively. Results of the observation are shown in FIGS. 3 to 11.

Figure 3:
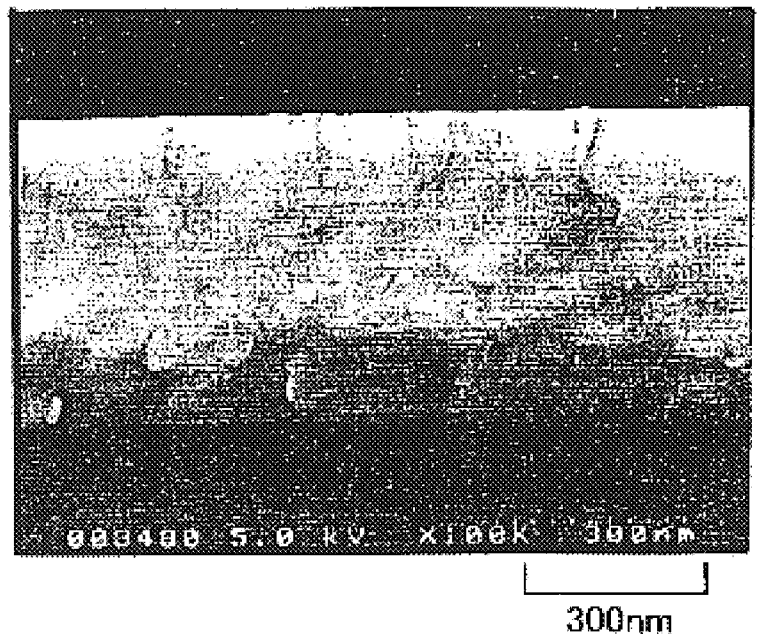
Figure 3:
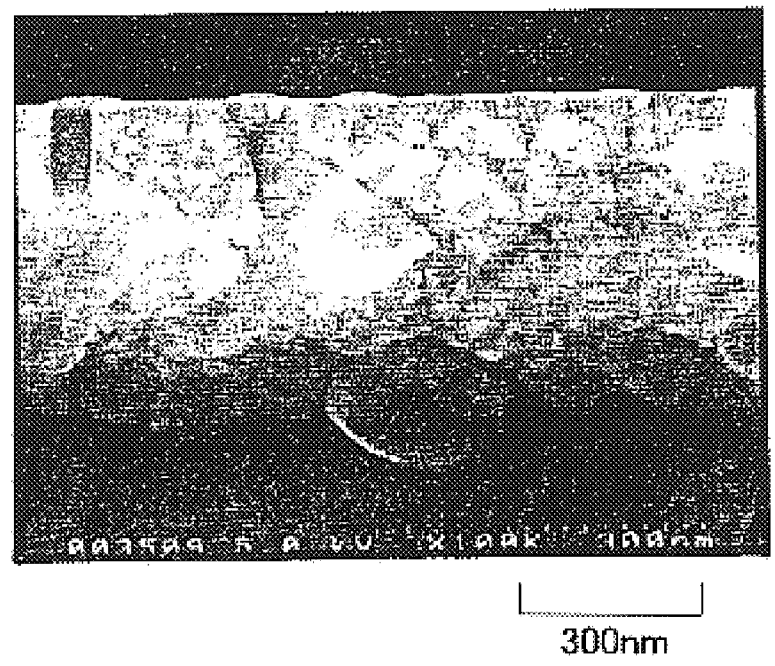
Figure 4:
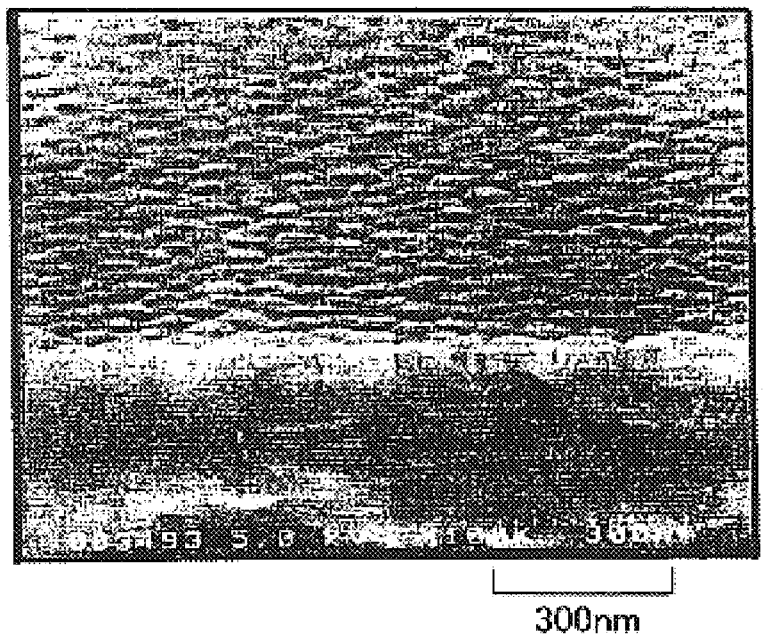
Figure 4:
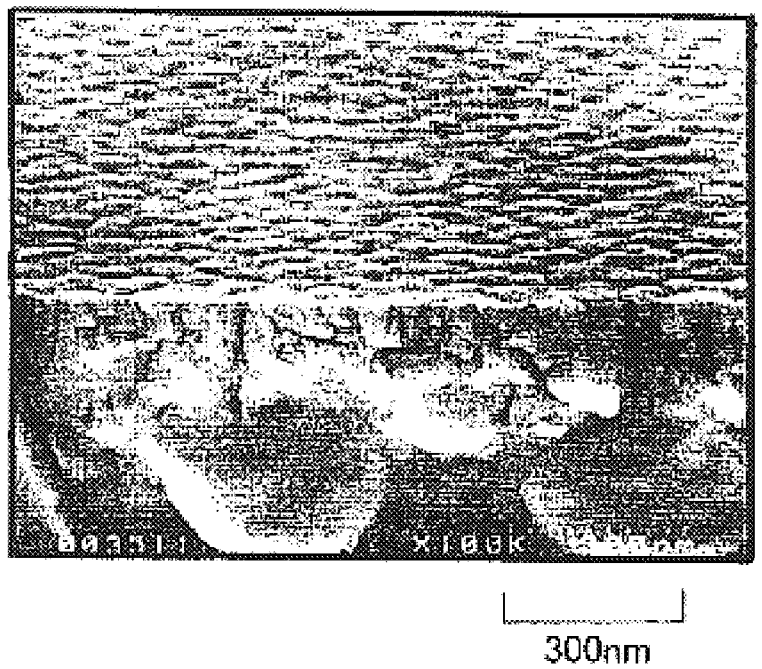
Figure 5:
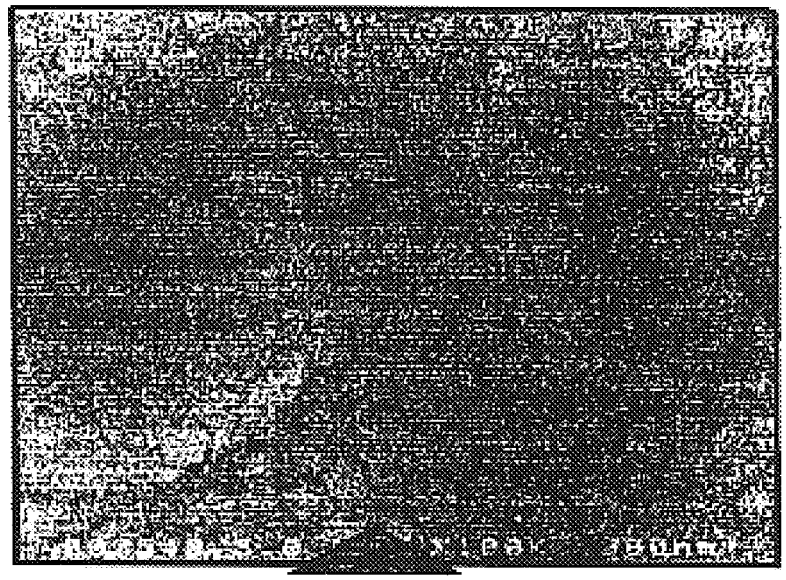
FIG. 5 shows an SEM photograph obtained by photographing the $LaF_3$ film formed on the (111) plane of fluorite from a directly overhead position.

FIGS. 3 to 5 show SEM photographs obtained by photographing, in different directions, the $LaF_3$ film formed on the fluorite (111) plane manufactured in the first embodiment. In order to perform the observation for the cross sections and the observation from obliquely upward positions, the sample was cut. At first, the sample is cut perpendicularly to the film formation plane ((111) plane), and the appeared plane (plane perpendicular to the film formation plane) is designated as "cross section (i)". Subsequently, the sample is rotated by 90 degrees about the vertical axis while maintaining the film formation plane to be horizontal. The sample is cut perpendicularly to the film formation plane again, and the appeared plane is designated as "cross section (ii)". The cross section (ii) is perpendicular to any one of the cross section (i) and the film formation plane. The cross section (i) and the cross section (ii) are mutually relative ones, which are used for only the purpose of explanation. Therefore, in FIG. 3, for the sake of convenience, the observation, which was performed in the direction in which one of the cross sections was viewed, was expressed by "observation direction (0 degree)", and the observation, which was performed in the direction in which the other cross section was viewed, was expressed by "observation direction (90 degrees)". In the following description, FIGS. 6 to 11 are illustrated in the same manner as described above.

As shown in FIG. 3(a), when the cross section is viewed in the observation direction (0 degree), the cross section has a dense and flat aspect. When the cross section is viewed from the obliquely upward position, polygons are tightly deposited on the surface as shown in FIG. 4(a). It is appreciated that the reason why the cross section is flat is that one side of each of the polygons is viewed. Subsequently, as shown in FIG. 3(b), when the cross section is viewed in the observation direction (90 degrees), then the cross section is dense but rough, and it has such an aspect that the respective tips are sharp. As shown in FIG. 4(b), when the cross section is viewed in the obliquely upward position, it is appreciated that the reason why the cross section is rough and sharp is that the respective apexes of the polygons observed on the surface are directed in the observation direction (toward the front). Finally, as shown in FIG. 5, when the cross section is viewed from the directly overhead position, it is easily appreciated that any one of the polygons is approximately hexagonal, the polygons are aligned regularly without any gap, and the sizes thereof (distances between the opposing apexes of the hexagons) are uniform as well, i.e., about 70 nm.

According to the results of the X-ray diffraction mentioned above, it has been revealed that the hexagonal system $LaF_3$ is subjected to the C-axis orientation, i.e., the hexagonal plane is grown while directed in the directly overhead direction. Therefore, the hexagons are viewed and aligned regularly in the observation from the directly overhead position. The result of the X-ray diffraction and the result of the SEM observation are coincident with each other without any contradiction. As described above, it has been successfully confirmed that the LaF$_3$ film, which is formed on the (111) plane of the fluorite, has the dense structure equivalent to the bulk.

Figure 6:
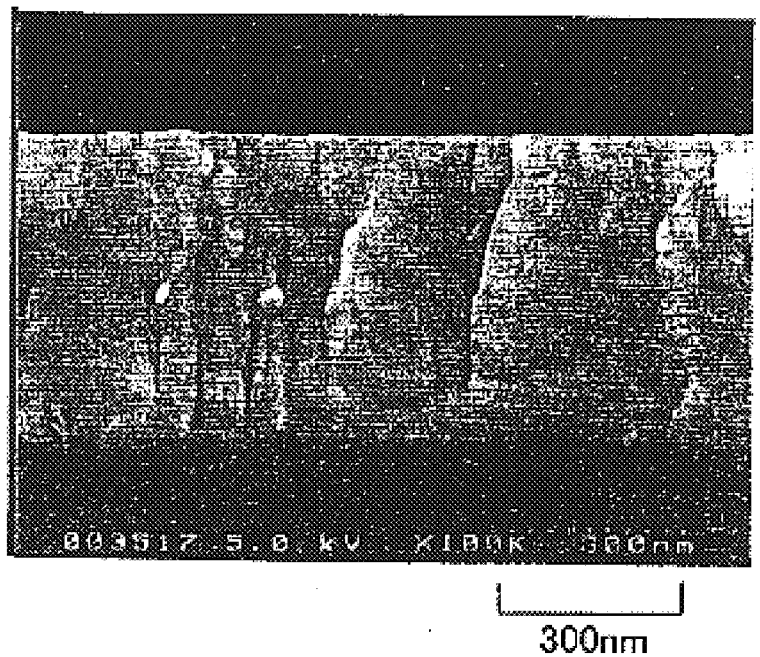
Figure 6:
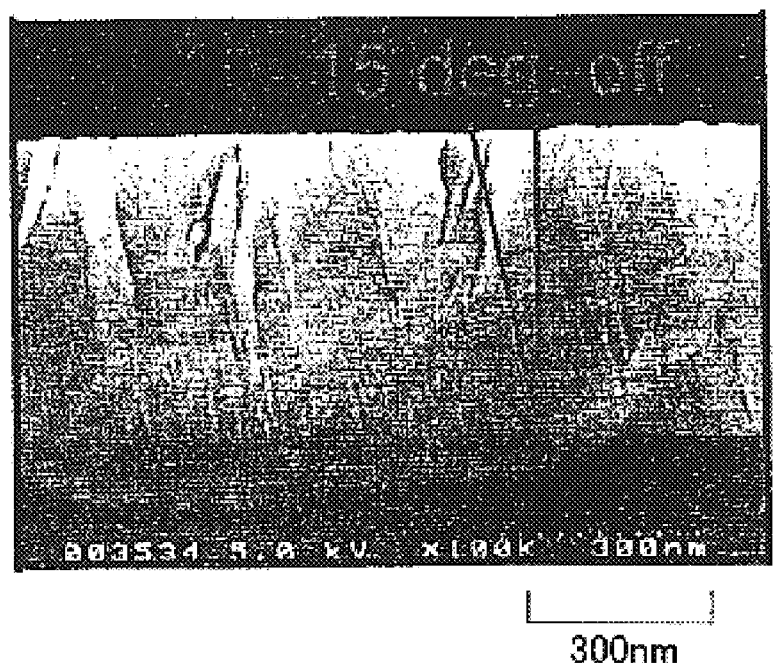
Figure 7:
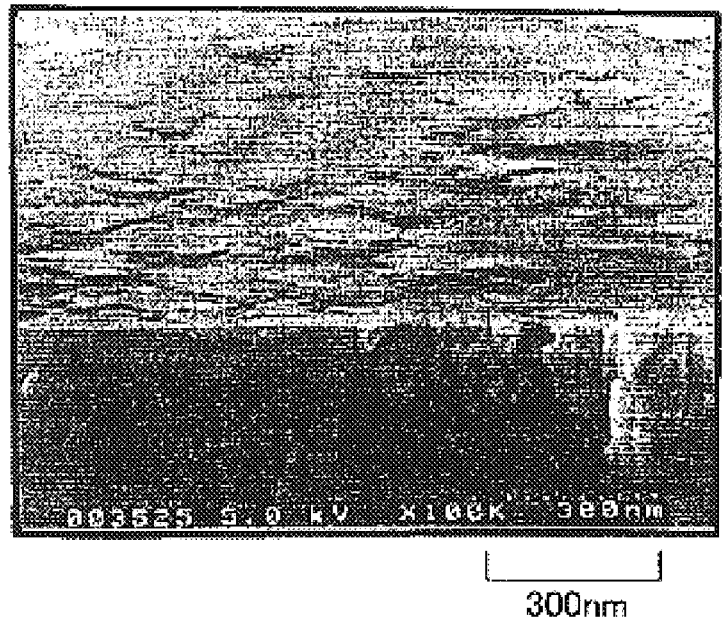
Figure 7:
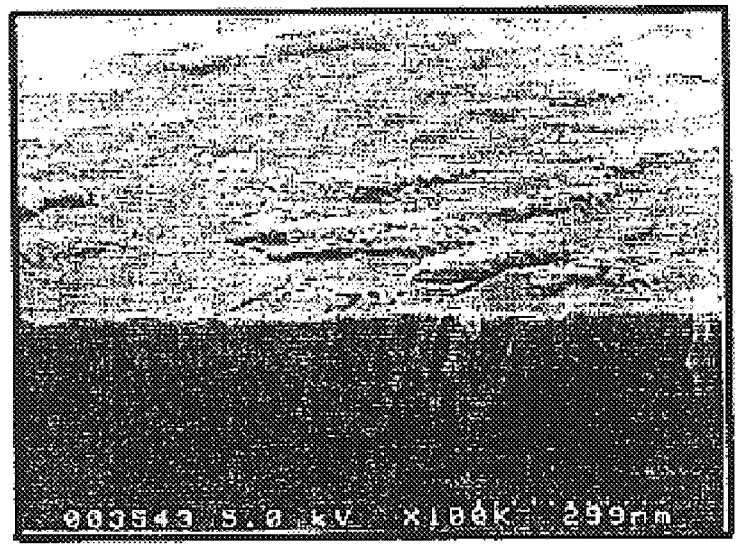
Figure 8:
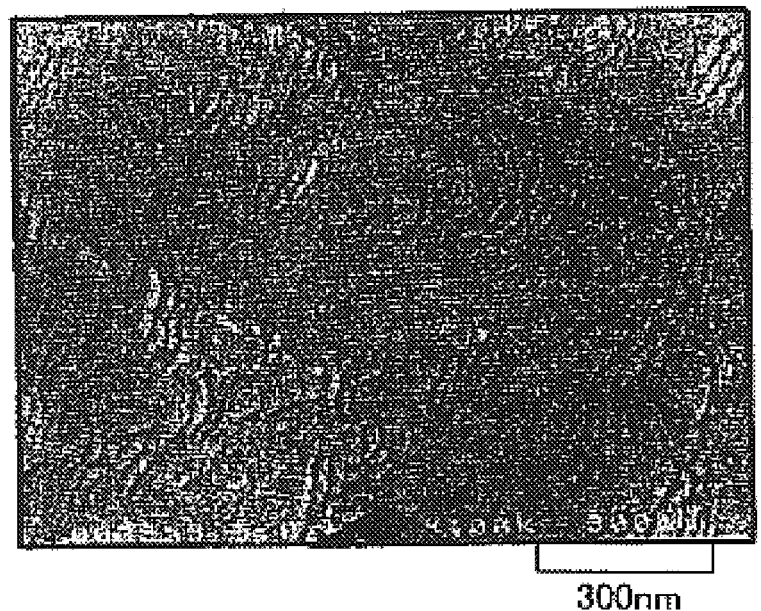
FIG. 8(a) shows an SEM photograph obtained by photographing the $LaF_3$ film formed on the plane inclined by 15 degrees from the (111) plane of fluorite from a directly overhead position, and FIG. 8(b) conceptually shows the structure of the $LaF_3$ film.
Figure 8:
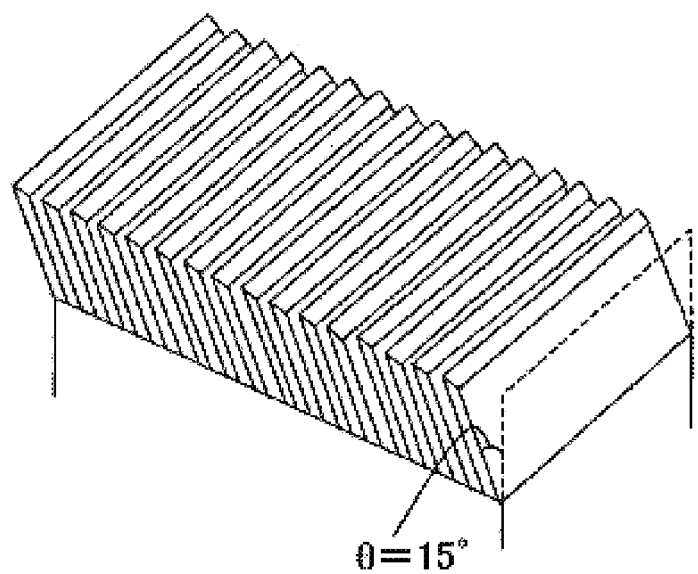

FIGS. 6 to 8 show SEM photographs obtained by photographing, in different directions, the LaF$_3$ film formed on the plane inclined by 15 degrees from the fluorite (111) plane manufactured in the second embodiment. As shown in FIG. 6(a), when the cross section is viewed in the observation direction (0 degree), the cross section has such an aspect that dense, flat, and large plates are overlapped in many layers. When the cross section is viewed from the obliquely upward position, then the structure, which is similar to the steps or the ripplet, is observed on the surface, and the large plate of the cross section is coincident with the wave surface of the ripplet as shown in FIG. 7(a). Subsequently, when the cross section is viewed in the observation direction (90 degrees), then thin plate-shaped structural members and gaps are alternately aligned regularly at equal intervals in parallel in the cross section, and each of them is continuous in straight line from the interface with respect to the substrate to the film surface without any intermediate interruption. According to the observation in this direction, it is appreciated that the structure has a large surface area as compared with the LaF$_3$ film of the first embodiment (FIG. 3(b)). Further, it is appreciated from the photograph (FIG. 6(b)) that the angle, which is formed by the thin plate-shaped columnar structural member with respect to the normal line of the film formation plane (i.e., the interface with respect to the substrate), is about 15 degrees.

As described above, it has been clarified from the X-ray diffraction that the film formation plane of the sample of the second embodiment is inclined by 15 degrees from the (111) plane of the fluorite, and the (00L) plane of the LaF$_3$ film grown on the film formation plane is strictly inclined by 15 degrees as well. Therefore, the respective thin plate-shaped structural members, which are observed in the photograph of the cross section, result from the selective growth of LaF$_3$ in the [00L] direction not in any other crystal direction. Therefore, it has been revealed that LaF$_3$ is selectively grown in the [00L] direction with respect to the fluorite (111) plane when the film formation plane of the fluorite is deviated from the (111) plane. When the cross section is viewed from the obliquely upward position in the observation direction (90 degrees), the thin plate-shaped structural members are coincident with the respective steps of the step structure of the surface as shown in FIG. 7(b). Finally, when the cross section is viewed in the directly overhead direction, the surface has the structure which is similar to the steps or the ripplet as shown in FIG. 8(a). No hexagonal member is observed unlike the case of the LaF$_3$ film on the fluorite in which the film formation plane is finished as the (111) plane as described above. Consequently, the dense and large plates are overlapped when the cross section is viewed in the observation direction (0 degree), while the thin plate-shaped structural members are alternately aligned together with the gaps when the cross section is viewed in the observation direction (90 degrees). This fact means that the thin plate-shaped structural members are grown obliquely with respect to the film formation plane while maintaining constant spacing distances as schematically illustrated in FIG. 8(b).

Figure 9:
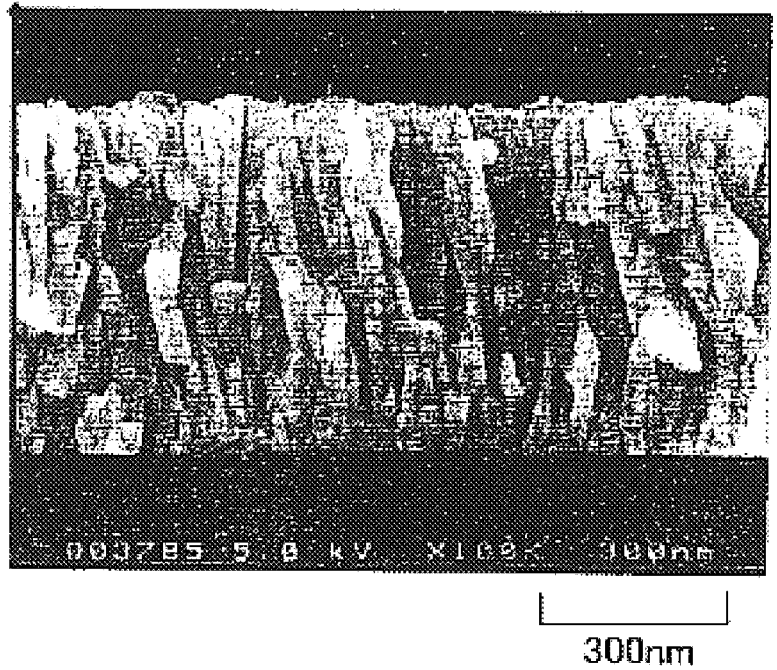
Figure 9:
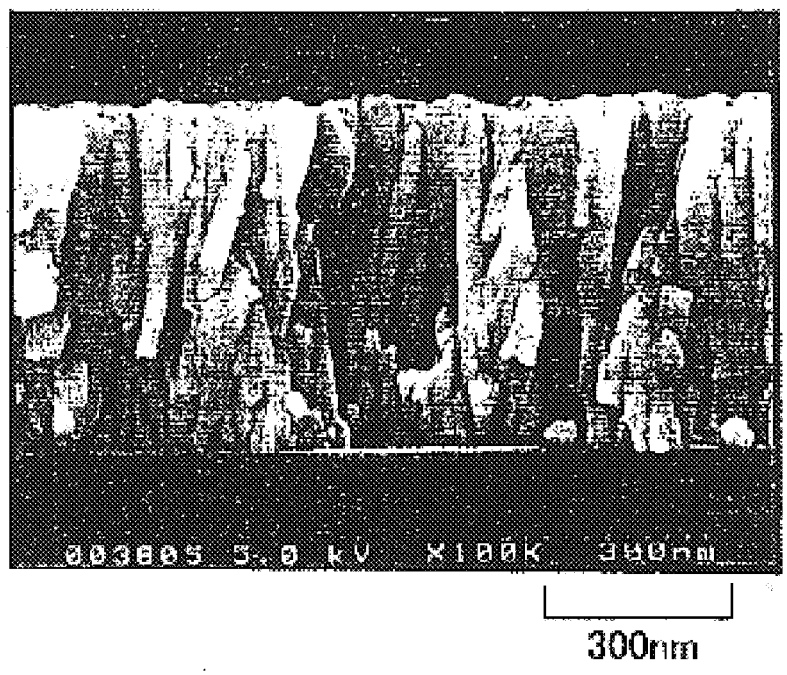
Figure 10:
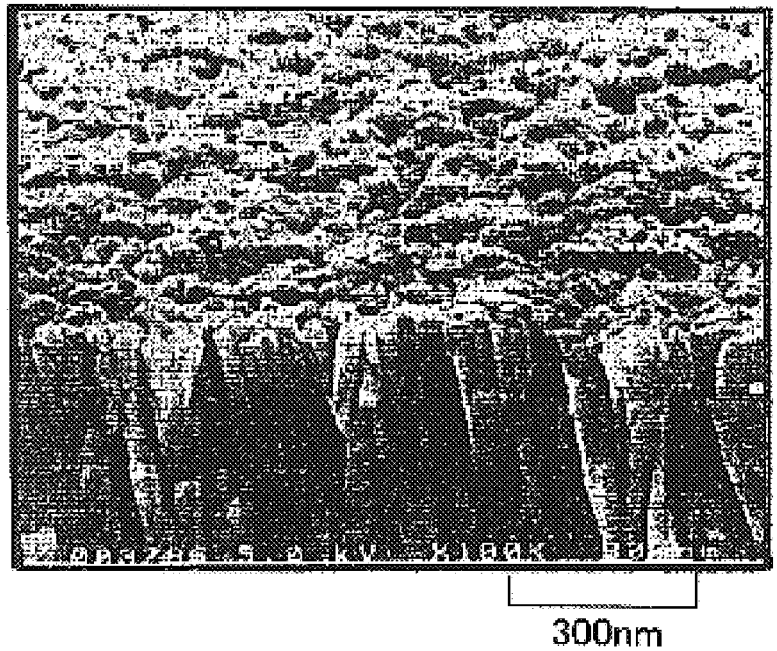
Figure 10:
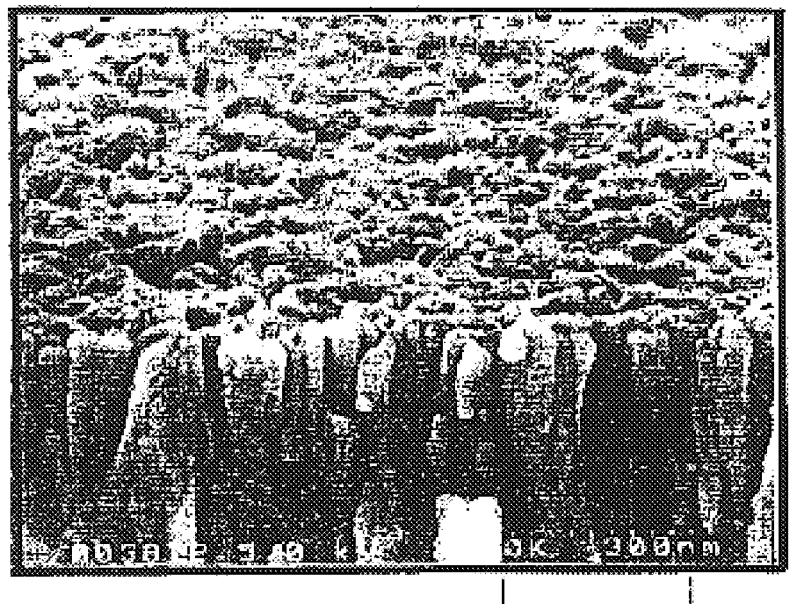
Figure 11:
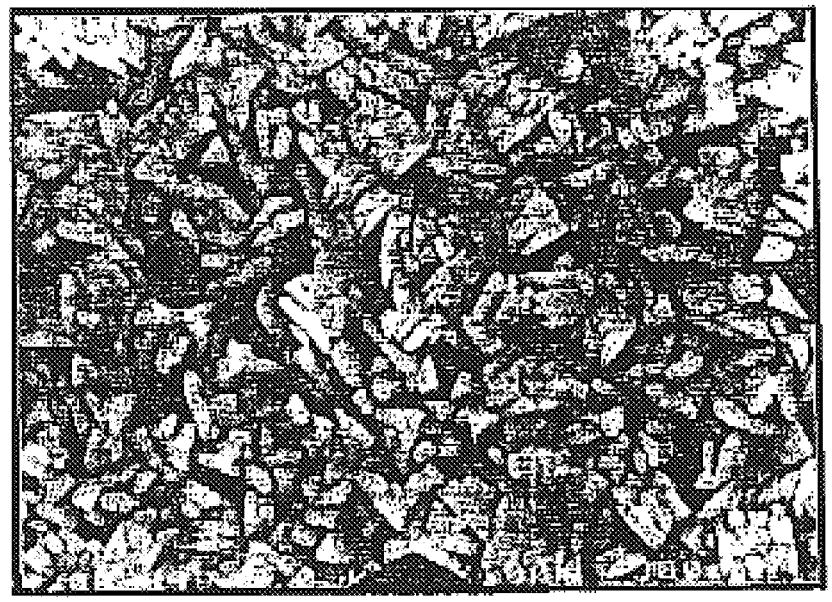
FIG. 11 shows an SEM photograph obtained by photographing the $LaF_3$ film formed on quartz from a directly overhead position.
Figure 11:

FIGS. 9 to 11 show SEM photographs obtained by photographing, in relation to the cross section, the obliquely upward position, and the directly overhead position, the sample having the LaF$_3$ film formed on the quartz glass substrate manufactured in Comparative Example 1. As shown in FIGS. 9(a), 9(b), 10(a), and 10(b), even when the observation is made in relation to any one of the cross section and the obliquely upward position, then there is no difference between the observation direction (0 degree) and the observation direction (90 degrees), and an extremely coarse columnar structure is observed. As shown in FIG. 11, it is comprehensively appreciated in the observation from the directly overhead position as well that the coarse columnar structure, in which the filling rate is extremely low and the surface area is extremely large, is observed, which is clearly different from the LaF$_3$ film on the fluorite. The result of the X-ray diffraction for the LaF$_3$ film on the MgF$_2$ film was completely equivalent to that for the LaF$_3$ film on the quartz glass substrate, and the result of the SEM observation for the former was also completely equivalent to that for the latter. According to the above, it has been clarified that the form of growth of the LaF$_3$ film greatly differs depending on the underlying base, and consequently the structure of the deposited film, especially the property of densification or coarseness/minuteness is extremely changed.

SIMS Measurement

Figure 12:
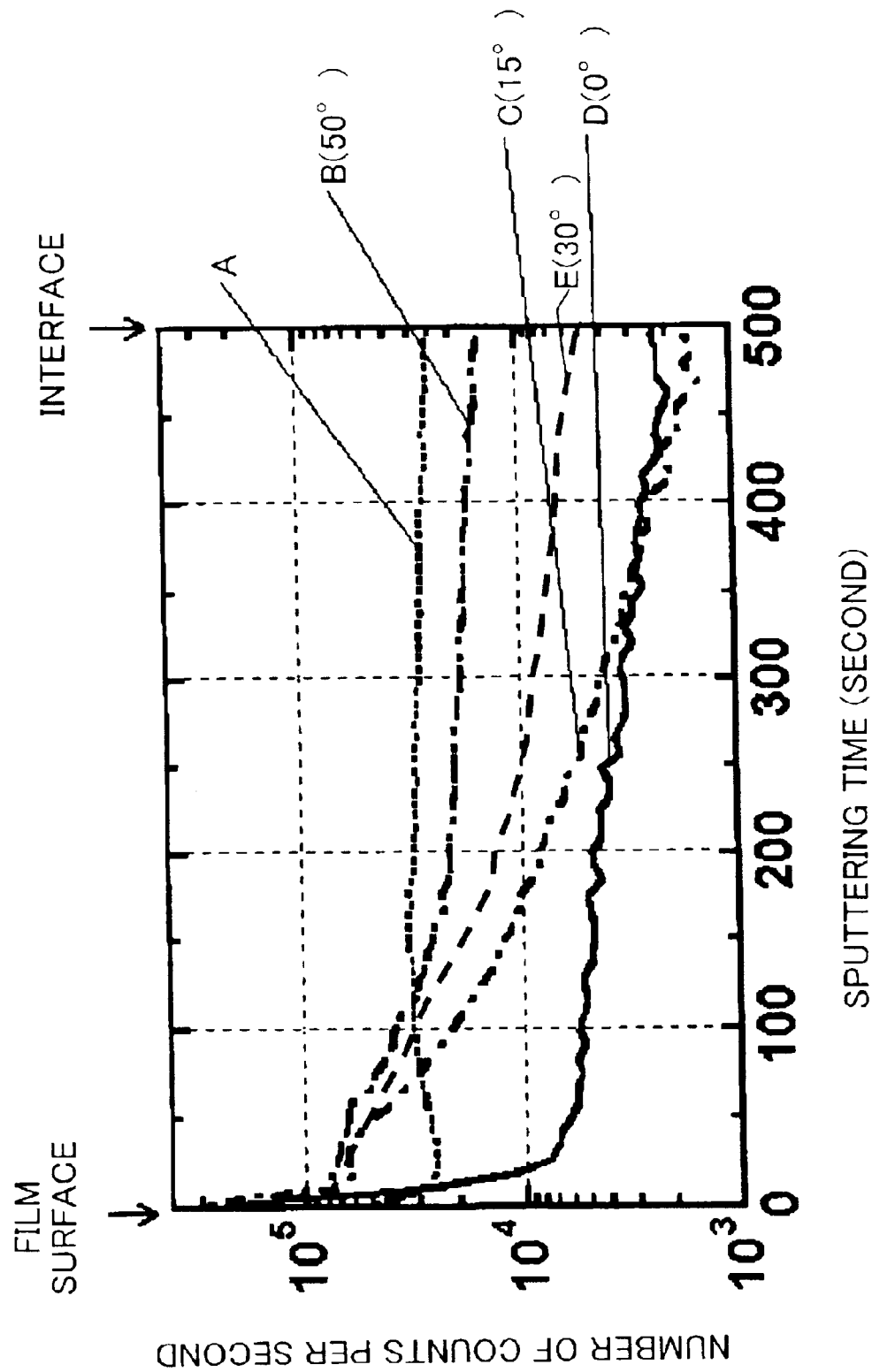
FIG. 12 shows results of the analysis of the oxygen atom concentration distributions in the depth direction of $LaF_3$ films of Samples A to E by means of SIMS (secondary ion mass spectrometry).
Figure 13:
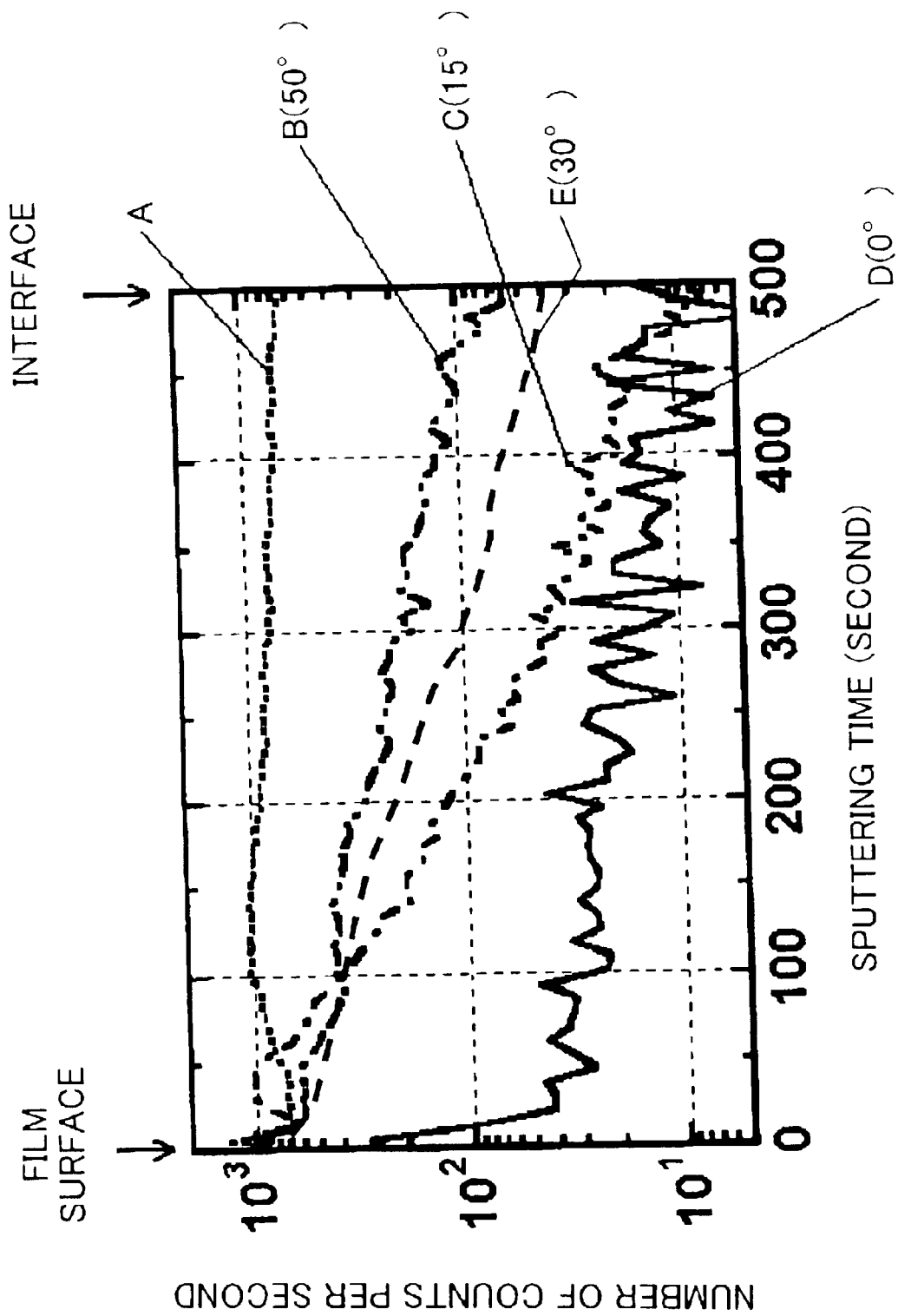
FIG. 13 shows results of the analysis of the hydroxyl group concentration distributions in the depth direction of the $LaF_3$ films of Samples A to E by means of SIMS (secondary ion mass spectrometry).

Next, FIGS. 12 and 13 show results of the analysis of the oxygen atom concentration distribution and the hydroxyl group concentration distribution in the film depth direction by means of SIMS (secondary ion mass spectrometry) in relation to the samples for which the SEM observation results have been described. In this analysis, Cs$^+$ was used as the primary ion. Samples were designated as A to E. Sample A represents the LaF$_3$ film formed on the quartz glass (Comparative Example 1), Sample B represents the LaF$_3$ film formed on the plane inclined by 50 degrees from the (111) plane of the fluorite, Sample C represents the LaF$_3$ film formed on the plane inclined by 15 degrees from the (111) plane of the fluorite (second embodiment), Sample D represents the LaF$_3$ film formed on the (111) plane of the fluorite (first embodiment), and Sample E represents an LaF$_3$ film formed on a plane inclined by 30 degrees from the (111) plane. Sample E was prepared in the same manner as in the second embodiment except that the plane inclined by 30 degrees from the (111) plane was cleaved.

The primary ion was radiated onto the sample to successively effect the sputtering in the depth direction from the surface. The particles, which were emitted by the sputtering, are successively ionized, and they are introduced as secondary ions into the mass spectrometer to be counted thereby. In this case, the sputtering particles were negatively ionized to produce the secondary ions which were detected. Detected species were $^{139}$La$^{19}$F, $^{19}$F, $^{16}$O, $^{16}$O$^1$H, and $^1$H. In order to offset the dispersions of those including, for example, the measurement sensitivity among the samples, the numbers of counts of $^{16}$O$^1$H and $^1$H detected from the respective samples were normalized with the number of counts of $^{139}$La$^{19}$F simultaneously detected from the respective samples.

FIG. 12 shows the oxygen atom concentration distribution in the depth direction of the LaF$_3$ film. FIG. 13 shows the hydroxyl group concentration ($^{16}$O$^1$H) distribution in the depth direction of the LaF$_3$ film. In the both graphs, the vertical axis represents the number of counts, and the horizontal axis represents the sputtering time (second). It is demonstrated that the larger the number of counts is, the higher the concentration is. The sputtering time corresponds to the depth direction of the film. The sputtering time 0 second directly means the film surface. The increasing sputtering time is illustrative of the information obtained from the deeper portion of the film. The rightward end of the graph indicates the film/substrate interface. In any one of the films, the concentration is highest at the surface, and the concentration is lowered at inner positions. This means the fact that the reactions occur together with water and oxygen in the air after the film is exposed to the atmospheric air after the completion of the film formation, for the following reason. That is, if the process, in which oxygen is incorporated during the film formation, is dominant, then the concentrations of oxygen and hydroxyl group should be constant in the film, or the concentrations of oxygen and hydroxyl group should be increased at earlier stages of the film formation. On such an assumption, it is impossible to obtain the distribution as shown in FIG. 12 in which the concentration is highest at the surface and the concentration is lowered at inner positions of the film.

In any one of the $LaF_3$ films, the oxygen atom concentration and the hydroxyl group concentration are equivalent at the outermost surface. However, the difference becomes conspicuous at inner positions in the film. At first, the oxygen atom concentration and the hydroxyl group concentration are overwhelmingly high, and the concentrations are high until the film/substrate interface in Samples A and B as compared with Samples C and D, which results from the following fact. That is, as also clarified from the SEM photographs shown in FIGS. 9 to 11, Sample A has the coarse columnar structure in which the filling rate is low. Therefore, water and oxygen in the atmospheric air easily makes the invasion into the deeper portions in the film to cause the adsorption and the chemical reactions. On the contrary, the $LaF_3$ films of Samples C, D, and E do not have the coarse structure unlike the film on the quartz glass. Therefore, the oxygen atom concentration and the hydroxyl group concentration are suppressed to be low at a position of certain depth and positions of depths deeper than the above. The oxygen atom concentration in the film is approximately at an identical degree in the $LaF_3$ films of Samples A and B.

The difference is also conspicuous between the $LaF_3$ film on the fluorite in which the film formation plane is finished to be the (111) plane (Sample D) and the $LaF_3$ film on the fluorite in which the film formation plane is finished while being inclined by 15 degrees from the (111) plane (Sample C). In the former, although the oxygen atom concentration is high and the hydroxyl group concentration is high equivalently to the two other films at the outermost surface, the oxygen atom concentration and the hydroxyl group concentration are suddenly decreased at slightly inner positions in the film, and the concentrations are low and constant at deeper positions. On the other hand, in the latter, although the oxygen atom concentration and the hydroxyl group concentration are certainly decreased at inner positions as starting from the surface, the concentrations are not decreased suddenly unlike the former. When the both are compared with each other while taking the notice of the period of the sputtering times of 0 to 400 seconds corresponding to the half of the film thickness of 500 nm on the front surface side, the oxygen atom concentration is high and the hydroxyl group concentration is high in the latter. As described above, according to FIGS. 12 and 13, it is appreciated that the hydroxylation area and the oxidation area are decreased by the optical element of the present invention. When Samples B to E are compared with each other, it is appreciated that the larger the angle of inclination from the (111) plane is, the higher the concentrations of oxygen atom and hydroxyl group contained in the film are.

Vacuum Ultraviolet Spectroscopic Measurement

Figure 14:
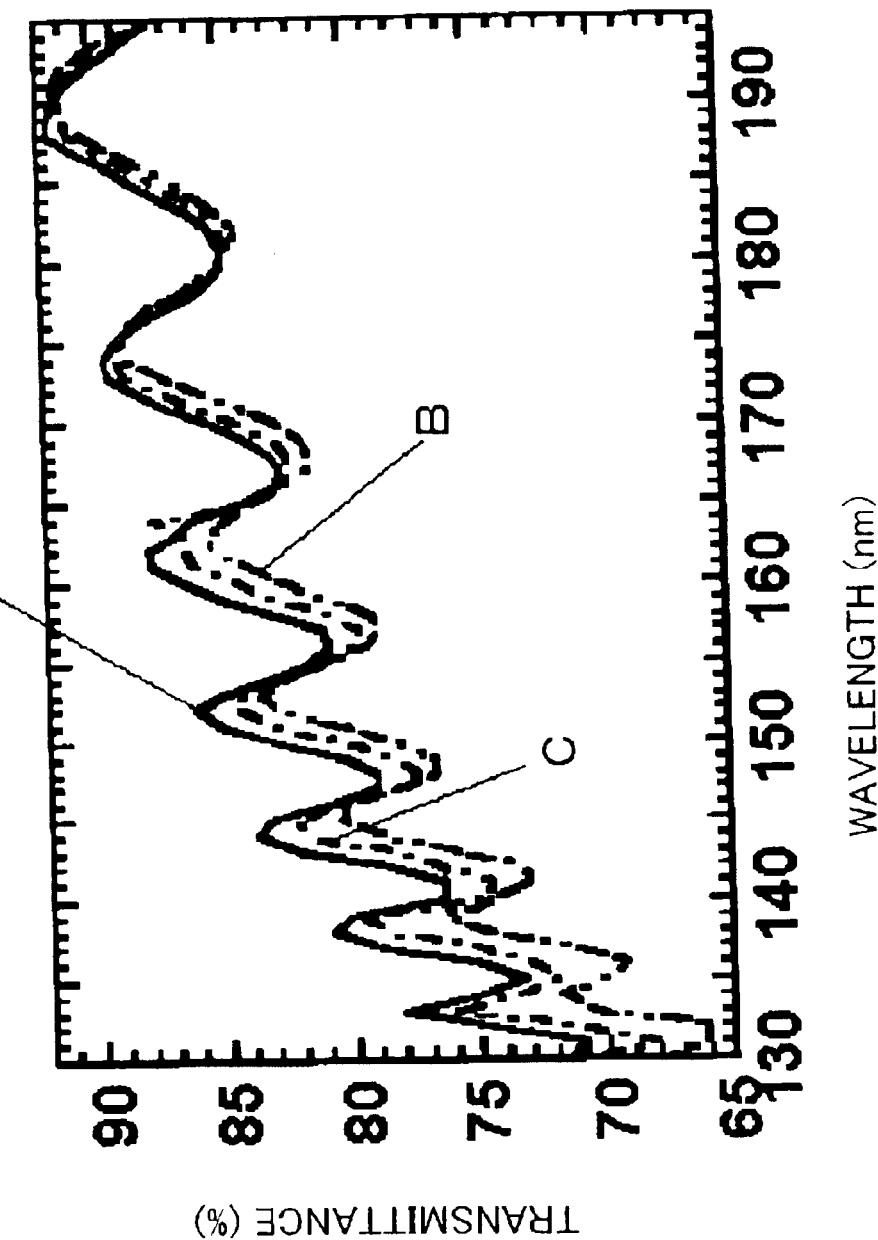
FIG. 14 shows the transmittances obtained by performing the vacuum ultraviolet spectroscopic measurement for $LaF_3$ films of Samples B to D.
Figure 15:
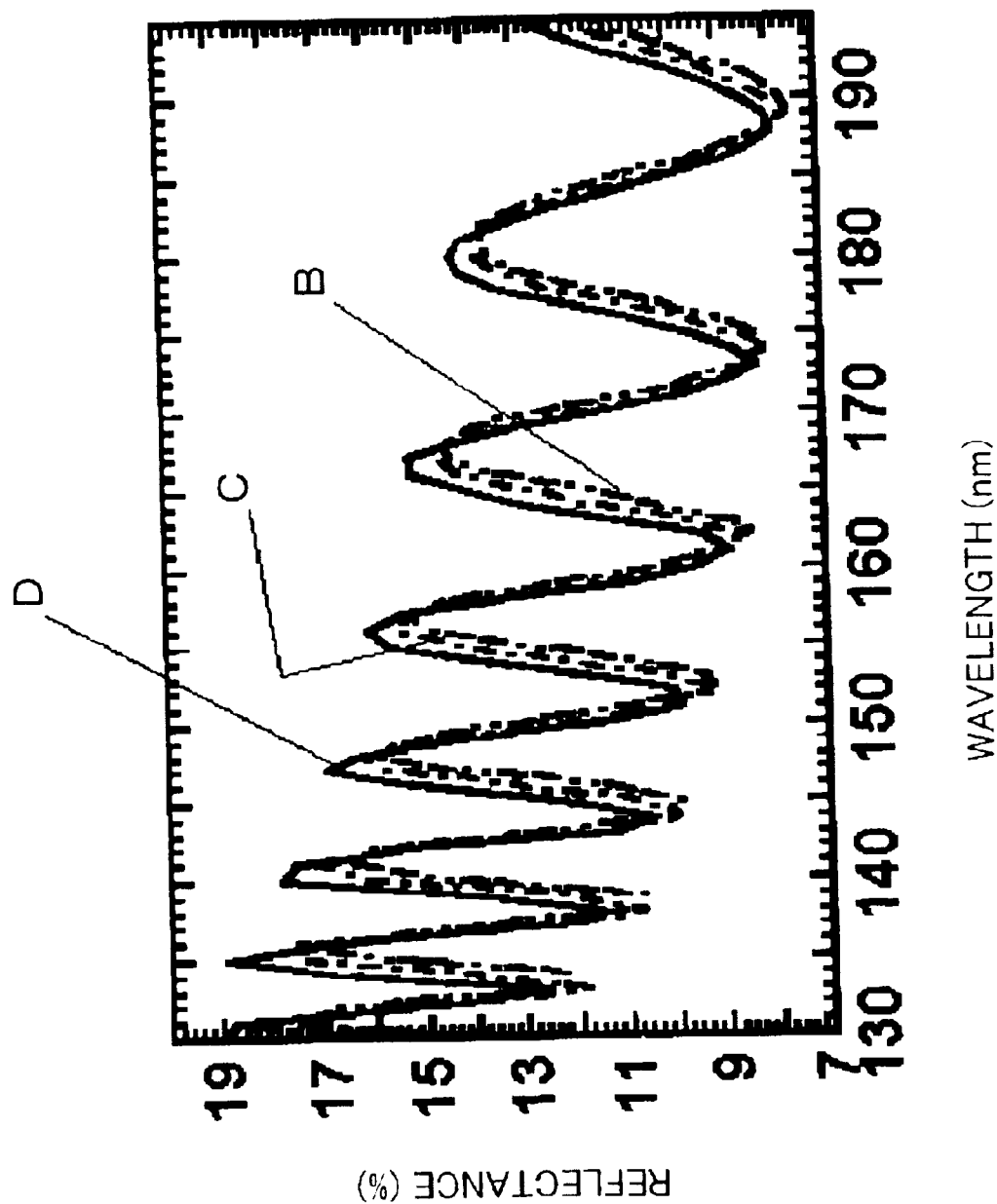
FIG. 15 shows the reflectances obtained by performing the vacuum ultraviolet spectroscopic measurement for the $LaF_3$ films of Samples B to D.
Figure 16:
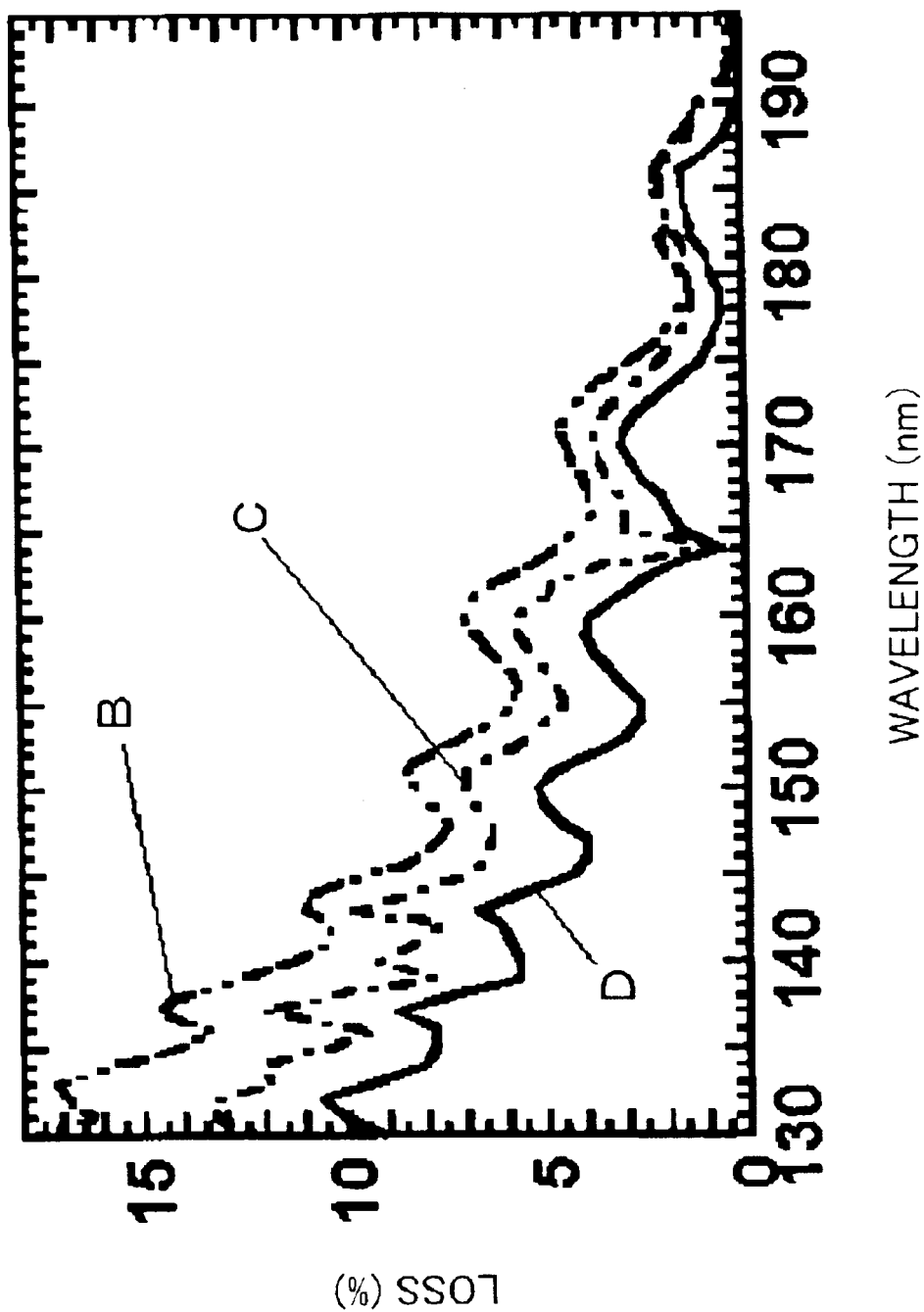
FIG. 16 shows the losses calculated from the transmittances and the reflectances obtained by performing the vacuum ultraviolet spectroscopic measurement for the $LaF_3$ films of Samples B to D.

FIGS. 14 to 16 show results of the vacuum ultraviolet spectroscopic measurement for the $LaF_3$ film formed on the (111) plane of the fluorite (Sample D), the $LaF_3$ film formed on the plane inclined by 15 degrees from the (111) plane of the fluorite (Sample C), and the $LaF_3$ film formed on the plane inclined by 50 degrees from the (111) plane of the fluorite (Sample B). FIG. 14 shows the measured spectroscopic transmittance with respect to the wavelength, FIG. 15 shows the measured reflectance with respect to the wavelength, and FIG. 16 shows the loss calculated from the measured values of the transmittance and the reflectance with respect to the wavelength.

As shown in FIG. 14, the smaller the inclination from the (111) plane is, the hither the transmittance is. Further, the difference in transmittance between the both is increased in the shorter wavelength regions. In other words, the larger the inclination is, the larger the amount of light absorption in the short wavelength region is. As having been described above, water and oxygen are not only physically adsorbed to the surface of $LaF_3$ exposed to the atmospheric air, but the chemical reactions also occur, and the La—OH and La—O bonds are produced on the surface of $LaF_3$ exposed to the atmospheric air. That is, the surface of $LaF_3$ exposed to the atmospheric air is hydroxylated and oxidized. In other words, the $LaF_3$ film approximately has the stoichiometric composition of La:F=1:3 as the entire film. However, the fluorine deficiency occurs in the vicinity of the surface exposed to the atmospheric air as a result of the chemical reaction with water in the atmospheric air to cause the oxidation and the hydroxylation. The vacuum ultraviolet light is absorbed by the oxidation area and the hydroxylation area, and it is not transmitted therethrough. Therefore, as for the $LaF_3$ film, the physically adsorbed water not only absorbs the vacuum ultraviolet light, but also the hydroxylation and oxidation areas, which are disposed on the surface exposed to the atmospheric air, absorb the vacuum ultraviolet light. It has been already demonstrated from the SEM photographs shown in FIGS. 3 to 5 and FIGS. 6 to 8 and the results of SIMS measurement shown in FIGS. 12 and 13 that the surface area is large and the concentrations of contained oxygen atom and hydroxyl group are also high when the inclination from the (111) plane is large. The hydroxylation and oxidation areas are increased, because the surface area is large when the inclination is large. As a result, the absorption is increased in the vacuum ultraviolet region.

On the other hand, as for the reflectance shown in FIG. 15, the smaller the inclination is, the higher the reflectance is. The difference is increased in the shorter wavelength regions. The structure is dense when the inclination is small, and hence the refractive index is high as well. Therefore, the reflectance is high.

Finally, the optical loss calculated from the measured values of the transmittance and the reflectance is confirmed with reference to FIG. 16. The optical loss refers to the value obtained by subtracting the transmittance (%) and the reflectance (%) from 100% provided that the intensity of the incoming light beam is 100%. Of course, when the inclination is small, the loss is small, because the light absorption is decreased. The factor of the loss includes the absorption and the scattering. However, the absorption is dominant in the loss in the $LaF_3$ film in the vacuum ultraviolet region.

As described above, the following fact has been found out. That is, it is extremely important that the film formation plane of the underlying base fluorite is correctly finished to be the (111) plane in order to obtain the $LaF_3$ film which causes less absorption in the vacuum ultraviolet region. When the film formation plane of the fluorite is correctly finished to be the (111) plane, and the $LaF_3$ film is formed thereon, then the $LaF_3$ film, which is dense equivalently to the bulk, has been successfully manufactured even by using the resistance heating type vacuum deposition method performed at the relatively low temperature of less than 300° C. When the film, which is dense equivalently to the bulk, is formed, then the surface area is decreased, and the hydroxylation and oxidation areas generated on the surface exposed to the atmospheric air are decreased. Thus, the absorption has been successfully suppressed in the vacuum ultraviolet region.

As a result of our researches performed until now, the following fact has been affirmed. That is, it is most desirable that the (111) plane is correctly exposed on the film formation plane of the underlying base fluorite. However, when the film formation plane has the inclination up to ±30 degrees from the (111) plane at the maximum, the $LaF_3$ film, which is deposited thereon, has the loss in the vacuum ultraviolet region which is at such a level that the $LaF_3$ film is allowable to be carried on the $F_2$ laser semiconductor exposure apparatus. Further, the $LaF_3$ film of the present invention, which is dense equivalently to the bulk, has been evaluated by using a method for evaluating the laser durability (method for chasing the change of absorption and scattering light by continuing the irradiation with the laser) as described in detail in Japanese Patent Application Laid-open No. 9-34706. As a result, it has been successfully confirmed that the laser resistance is remarkably improved as compared with the conventional $LaF_3$ film formed by the resistance heating type vacuum deposition method.

First Modified Embodiment

A sample was manufactured in the same manner as in the first embodiment except that the fluorite substrate was replaced with an $SrF_2$ substrate. The sample was evaluated in accordance with the method described above. As a result, it was revealed that an $LaF_3$ film formed on a (111) plane of the $SrF_2$ substrate was subjected to the crystal growth in the C-axis direction, and $LaF_3$ film, which was dense equivalently to the bulk, was formed, probably for the following reason. That is, it is considered that the crystalline structure of $SrF_2$ resides in the fluorite type cubic system which is the same as that of the fluoride, and the lattice constant is represented as a=0.57996 nm which is close to the lattice constant of the fluorite.

Second Modified Embodiment

A sample was manufactured in the same manner as in the first embodiment except that the fluorite substrate was replaced with a $BaF_2$ substrate. The sample was evaluated in accordance with the method described above. As a result, an $LaF_3$ film formed on a (111) plane of the $BaF_2$ substrate was subjected to the crystal growth in the C-axis direction, and $LaF_3$ film, which was dense equivalently to the bulk, was successfully produced, probably for the following reason. That is, it is considered that the crystalline structure of $BaF_2$ has the fluorite type cubic system which is the same as that of the fluoride, and the lattice constant is represented as a=0.62001 nm which is close to the lattice constant of the fluorite.

In the embodiments of the present invention, the $LaF_3$ film is produced by utilizing the resistance heating type vacuum deposition method with which the stoichiometric composition is obtained with ease. However, it has been revealed that an $LaF_3$ film, which is dense equivalently to the bulk and which is equivalent to those obtained in the embodiments of the present invention, can be also produced by means of any other film formation method including, for example, the methods such as the sputtering, the ion plating, the ion assist vapor deposition, and the molecular beam epitaxy provided that the condition, under which the $LaF_3$ film having the stoichiometric composition is obtained, is successfully achieved.

Third Embodiment

In this embodiment, an optical element equipped with an antireflection film having the following structure I as shown in FIG. 17(b) was manufactured. At first, a fluorite single crystal substrate with the exposed (111) plane was prepared in the same manner as in the first embodiment. An $MgF_2$ film was formed to have an optical film thickness of $\lambda/4$ (k=157 nm) on the (111) plane by means of the resistance heating type vacuum deposition method. Subsequently, a $CaF_2$ film was formed on the $MgF_2$ film by means of the resistance heating type vacuum deposition method while heating the substrate to 300° C. so that the (111) plane of the $CaF_2$ film was preferentially grown. The reason, why the substrate was heated when the $CaF_2$ film was formed, is that the dominant growth of the (111) plane is sufficiently advanced when the substrate temperature is not less than about 250° C., because of such a characteristic that the growth speed of the (111) plane of $CaF_2$ is relatively faster than those of other planes. The $CaF_2$ film was allowed to have $\lambda/2$ (k=157 nm) in which no contribution was made to the interference phenomenon of light. An $LaF_3$ film was formed to have an optical film thickness of $\lambda/4$ (k=157 nm) on the (111) plane of the obtained $CaF_2$ film by means of the resistance heating type vacuum deposition method. The substrate was heated to 250° C. during the execution of the resistance heating type vacuum deposition method. Finally, an $MgF_2$ film was formed to have an optical film thickness of $\lambda/4$ (k=157 nm) on the $LaF_3$ film by means of the resistance heating type vacuum deposition method.

For the purpose of comparison, optical elements having the following laminated structures II and III were also manufactured. In the case of the laminated structure II, the substrate was heated to only 250° C. during the film formation of the $CaF_2$ film, which is considered to be in an non-orientation crystal state. The conditions, under which the respective films of the laminated structures II and III were formed, were the same as the conditions under which the respective films of the laminated structure I were formed.

I: $MgF_2$ film/$LaF_3$ film/$CaF_2$ film (111) plane/$MgF_2$ film/fluorite (111) substrate;

II: $MgF_2$ film/$LaF_3$ film/$CaF_2$ film/$MgF_2$ film/fluorite (111) substrate;

III: $MgF_2$ film/$LaF_3$ film/$MgF_2$ film/fluorite (111) substrate.

Figure 18:
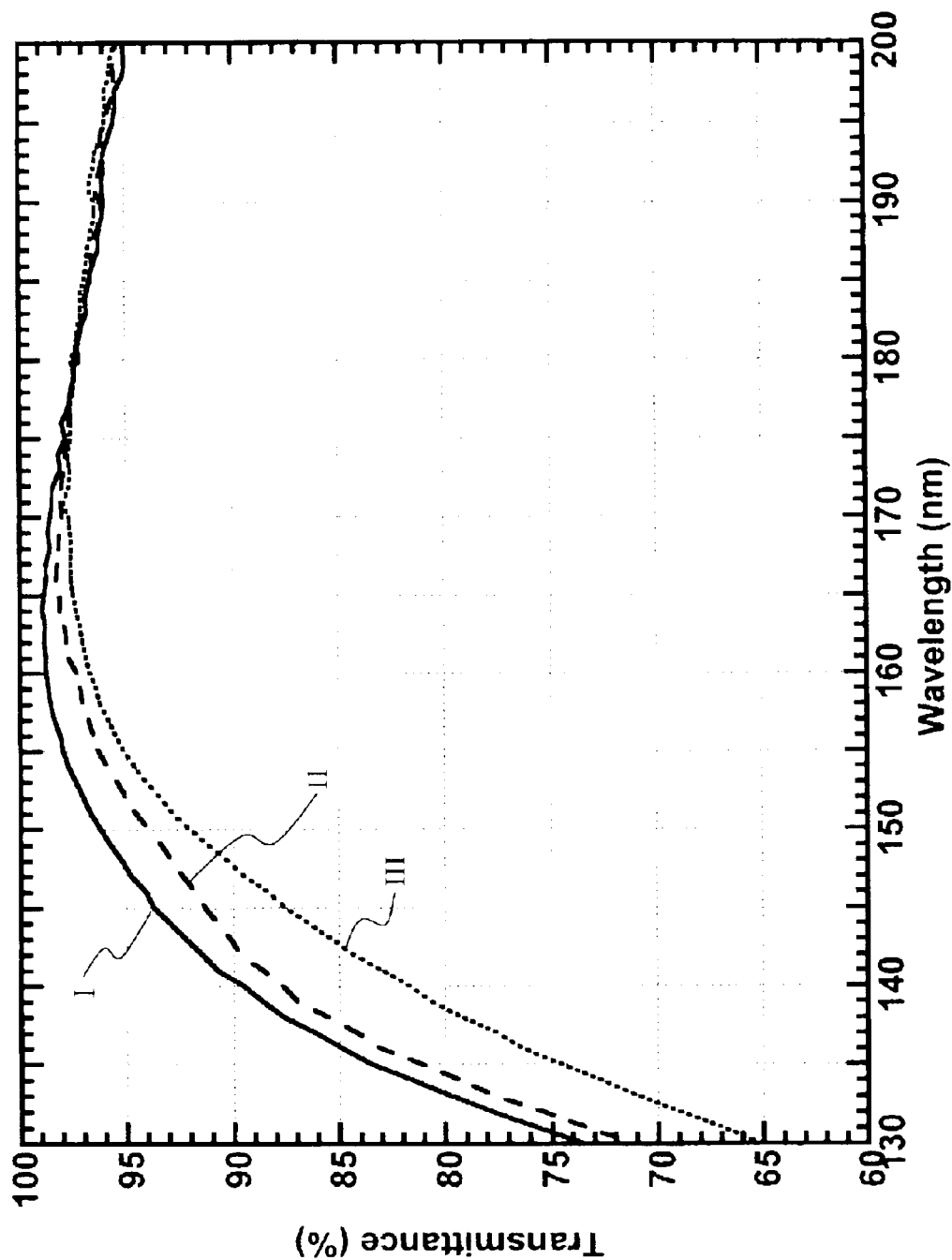
FIG. 18 shows a graph illustrating results of the measurement of the transmittances of samples having the laminated structures I to III manufactured in the third embodiment.

The transmittance was measured for the optical elements having the three types of the laminated structures as described above. Results are shown in FIG. 18. When the transmittances with respect to the light beam having a wavelength of 157 nm are compared with each other, then the transmittance is lowest in III in which the $LaF_3$ film having the columnar structure was deposited without inserting the $CaF_2$ film, the intermediate transmittance is exhibited by II in which the $LaF_3$ film having the plate-shaped structure was deposited by utilizing the $CaF_2$ film, and the transmittance is highest in I in which the $LaF_3$ film equivalent to the bulk was deposited by utilizing the $CaF_2$ film involving the (111) plane dominant growth. The $LaF_3$ film, which has a large light absorption coefficient as compared with other multilayer film-constituting substances, determines the transmittance in the vacuum ultraviolet region. Therefore, it is appreciated from FIG. 18 that the utmost reduction of the oxidation and hydroxylation areas of the $LaF_3$ film is extremely important.

In the case of the laminated structure I, the $LaF_3$ film, which is formed on the (111) plane of the $CaF_2$ film, has the dense structure equivalent to the bulk as illustrated in the SEM photographs shown in FIGS. 3 to 5. It is considered that the light absorption is extremely decreased, because the plane exposed to the atmospheric air disappears any longer. In the case of the laminated structure II, it is considered that the $LaF_3$ film, which is formed on the $CaF_2$ film, has the plate-shaped cross-sectional structure as illustrated in the SEM photographs shown in FIGS. 6 to 9, because the (111) plane of the underlying $CaF_2$ film is not grown sufficiently preferentially. In the case of the laminated structure III, the $LaF_3$ film having the high refractive index is laminated on the $MgF_2$ film having the low refractive index in the same manner as in the ordinary antireflection film. In this structure, the $LaF_3$ film is not subjected to the oriented growth on the $MgF_2$ film at all, for the following reason. That is, the crystalline structure and the lattice constant are completely different from each other between $MgF_2$ and $LaF_3$. Therefore, in the case of the laminated structure III, the $LaF_3$ film has the coarse columnar structure having a large surface area as illustrated in the SEM photographs shown in FIGS. 9 to 11, in which the hydroxylation and oxidation areas are increased, and the light absorption is increased. In the laminated structures I and II, an $SrF_2$ film or a $BaF_2$ film may be formed in place of the $CaF_2$ film. Also in these cases, the bulk or plate-shaped structure is obtained in the same manner as in $LaF_3$ formed on the $CaF_2$ film.

First Applied Embodiment

Figure 19:
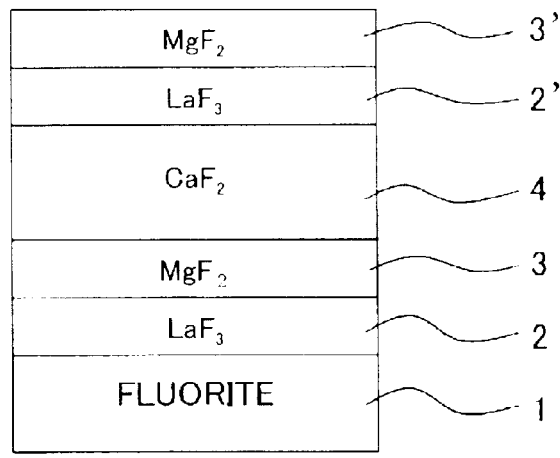
FIGS. 19(a) to 19(c) show other laminated structures of the optical element of the present invention.
Figure 19:
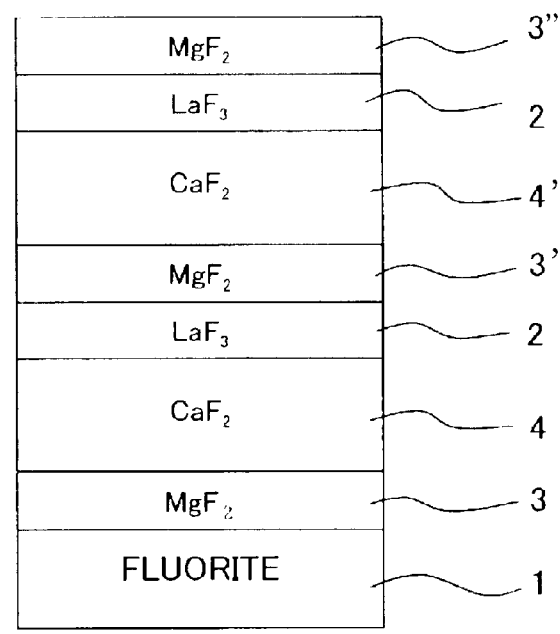
Figure 19:
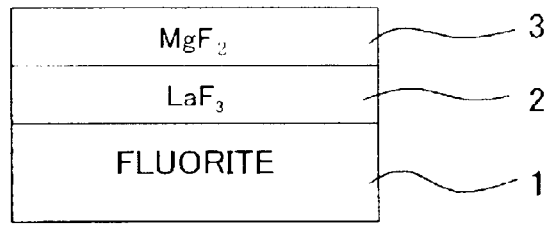

FIGS. 19(a) to 19(c) show other examples of the laminated structure of the optical element of the present invention. An optical element shown in FIG. 19(a) has a multilayer film comprising, on a fluorite substrate 1, an $LaF_3$ film 2, an $MgF_2$ film 3, a $CaF_2$ film 4, an $LaF_3$ film 2', and an $MgF_2$ film 3' in this order. An optical element shown in FIG. 19(b) has a multilayer film comprising, on a fluorite substrate 1, an $MgF_2$ film 3, a $CaF_2$ film 4, an $LaF_3$ film 2, an $MgF_2$ film 3', a $CaF_2$ film 4', an $LaF_3$ film 2', and an $MgF_2$ film 3" in this order. An optical element shown in FIG. 19(c) comprises an $LaF_3$ film 2 and an $MgF_2$ film 3 on a fluorite substrate 1. In any one of the optical elements shown in FIGS. 19(a) to 19(c), the (111) plane is disposed at the upper surface of the fluorite substrate 1. The $CaF_2$ film disposed at the underlayer of the $LaF_3$ film is formed so that the (111) plane is disposed at the upper surface. In any one of the optical elements shown in FIGS. 19(a) to 19(c), the fluorite and the $CaF_2$ film may be replaced with an $SrF_2$ film or a $BaF_2$ film. An $AlF_3$ film may be used in place of the $MgF_2$ film.

Second Applied Embodiment

Next, an explanation will be made about another structure of the optical element of the present invention. The foregoing description has been made as exemplified by the optical elements to be used for the light beam in the vacuum ultraviolet region by way of example. In these optical elements, the fluoride such as the fluorite has been used for the substrate material. Quartz glass, which is an oxide, is often used as the substrate material other than the fluoride for the light beam in the ultraviolet region. It is also necessary to decrease the light absorption of the $LaF_3$ film as far as possible in order to improve the transmittance of the entire multilayer film in the case of the fluoride multilayer film containing $LaF_3$ laminated on the quartz glass substrate.

Figure 20:
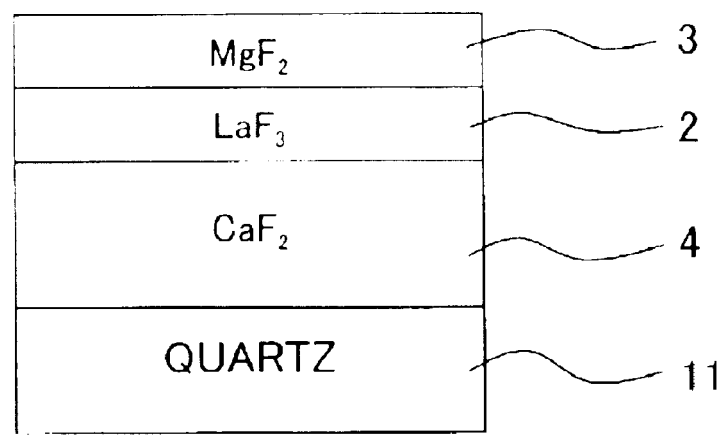
Figure 20:
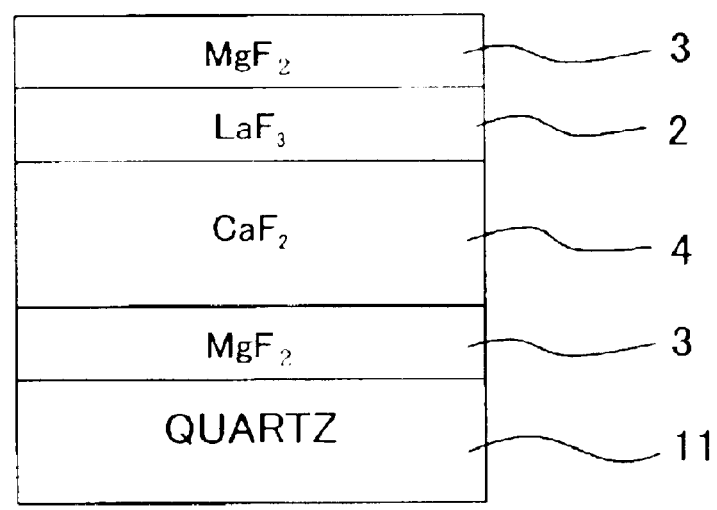

According to the present invention, as shown in FIG. 20(a), a $CaF_2$ film 4 may be formed on a quartz glass substrate 11, and an $LaF_3$ film 2 and an $MgF_2$ film 3 may be formed thereon respectively. When the $CaF_2$ film is formed, it is appropriate to heat the substrate so that the (111) plane is preferentially generated as explained in the third embodiment. When the $LaF_3$ film is formed on the $CaF_2$ film formed as described above, the $LaF_3$ film subjected to the C-axis orientation is obtained. The light absorption of the $LaF_3$ film is low. Therefore, it is possible to raise the transmittance of the entire optical element. In this case, an $SrF_2$ film or a $BaF_2$ film can be used in place of the $LaF_3$ film.

A modified embodiment of FIG. 20(a) is shown in FIG. 20(b) in which an $MgF_2$ film 3 may be formed on a quartz glass substrate 11, and a $CaF_2$ film 4, an $LaF_3$ film 2, and an $MgF_2$ film may be formed thereon respectively. In this case, an $AlF_3$ film may be used in place of the $MgF_2$ film.

The optical element of the present invention has been specifically explained above as exemplified by the embodiments. However, the present invention is not limited to the embodiments, which may be changed into those composed of a variety of multilayer film laminated structures and materials. The optical element is applicable to lenses having arbitrary shapes including, for example, lenses of the concave type, the convex type, and the concave/convex type, cylindrical lenses, planar surface lenses, and curved surface lenses having arbitrary curvatures. The lens may be embodied as a variety of lenses including, for example, objective lenses, light-collecting lenses, collimator lenses, fly's eye lenses, and projection lenses. The optical element of the present invention is usable for the illumination optical system or the projection optical system of the scanning type exposure apparatus as shown in FIG. 2. The exposure apparatus is not limited to the scanning type exposure apparatus. The present invention is applicable to a variety of exposure apparatuses including, for example, those of the full field exposure type called "stepper", the reflection type, the proximity type, and the aligner type. Details of the exposure apparatus are described, for example, in U.S. Pat. No. 5,835,275. This United States Patent is incorporated herein by reference so long as the laws or ordinances of the designated state or the selected state permit the incorporation.

According to the present invention, calcium fluoride ($CaF_2$) or fluorite is used for the substrate or the underlying base film, and the lanthanum fluoride ($LaF_3$) film is laminated on the specified crystal plane of the calcium fluoride ($CaF_2$) by utilizing the crystalline orientation. Accordingly, it is possible to obtain the lanthanum fluoride ($LaF_3$) film which is dense equivalently to the bulk and which has the small surface area. Accordingly, the surface of the lanthanum fluoride ($LaF_3$) film exposed to the atmospheric air is extremely decreased. Therefore, the hydroxylation area and the oxidation area, which are produced by the chemical reactions of the exposed surface, water, and oxygen, are also extremely decreased. When the hydroxylation area and the oxidation area, which absorb the vacuum ultraviolet light beam without transmitting the vacuum ultraviolet light beam therethrough, are extremely decreased, the transmittance of the entire lanthanum fluoride ($LaF_3$) film is increased. As a result, the amount of light, which is obtained at the stage of arrival at the wafer surface from the laser light source through as much as several tens of optical elements of the exposure apparatus for the vacuum ultraviolet light, is increased as compared with those obtained prior to the present invention. Therefore, the exposure time is shortened, and the throughput as the index of productivity is increased.

Further, according to the present invention, the hydroxylation area and the oxidation area, which are weakly resistant to the laser, are extremely decreased in the lanthanum fluoride ($LaF_3$) film. Accordingly, the laser durability of the entire lanthanum fluoride ($LaF_3$) film is improved. As a result, the frequency of maintenance, for example, for

What is claimed is:

1. An optical element comprising:
   an optical substrate which is formed of one of calcium fluoride, barium fluoride, and strontium fluoride; and
   a lanthanum fluoride film which is formed directly on the optical substrate,
   wherein crystal of the lanthanum fluoride film is grown in C-axis orientation on the optical substrate.

2. The optical element according to claim 1, wherein a plane of the optical substrate, on which the lanthanum fluoride film is formed, is a (111) plane or a plane inclined by an angle within ±30 degrees from a (111) plane.

3. An exposure apparatus for exposing a substrate with an image of a pattern formed on a mask, the exposure apparatus comprising:
   an illumination optical system which illuminates the mask with a vacuum ultraviolet light beam; and
   a projection optical system which includes the optical element as defined in claim 1 and which projects the image of the pattern onto the substrate.

4. An exposure apparatus for exposing a substrate with an image of a pattern formed on a mask, the exposure apparatus comprising:
   an illumination optical system which includes the optical element as defined in claim 1 and which illuminates the mask with a vacuum ultraviolet light beam; and
   a projection optical system which projects the image of the pattern onto the substrate.

5. An optical element comprising:
   an optical substrate;
   an underlayer which is formed of one of calcium fluoride, barium fluoride, and strontium fluoride; and
   a lanthanum fluoride film which is formed directly on the underlayer,
   wherein crystal of the lanthanum fluoride film is grown in C-axis orientation on the underlayer.

6. The optical element according to claim 5, wherein a plane of the underlayer, on which the lanthanum fluoride film is formed, is a (111) plane or a plane inclined by an angle within ±30 degrees from a (111) plane.

7. An exposure apparatus for exposing a substrate with an image of a pattern formed on a mask, the exposure apparatus comprising:
   an illumination optical system which illuminates the mask with a vacuum ultraviolet light beam; and
   a projection optical system which includes the optical element as defined in claim 4 and which projects the image of the pattern onto the substrate.

8. An exposure apparatus for exposing a substrate with an image of a pattern formed on a mask, the exposure apparatus comprising:
   an illumination optical system which includes the optical element as defined in claim 4 and which illuminates the mask with a vacuum ultraviolet light beam; and
   a projection optical system which projects the image of the pattern onto the substrate.

9. A method for producing an optical element, comprising:
   preparing an optical substrate which is formed of one of calcium fluoride, barium fluoride, and strontium fluoride and a plane of which is a (111) plane or a plane inclined by an angle within ±30 degrees from a (111) plane; and
   forming a lanthanum fluoride film on the plane of the optical substrate.

10. The method for producing the optical element according to claim 9, wherein crystal of the lanthanum fluoride film is grown in C-axis orientation on the optical substrate.

11. The method for producing the optical element according to claim 10, wherein the lanthanum fluoride film is formed by a resistance heating type vacuum deposition method.

12. A method for producing an optical element, comprising:
   forming an underlayer composed of one of calcium fluoride, barium fluoride, and strontium fluoride on an optical substrate while heating the optical substrate so that a (111) plane or a plane inclined by an angle within ±30 degrees from a (111) plane appears; and
   forming a lanthanum fluoride film on the underlayer.

13. The method for producing the optical element according to claim 12, wherein the substrate is heated to a temperature of not less than 250° C.

14. The method for producing the optical element according to claim 12, wherein a plane of the formed underlayer is the (111) plane or the plane inclined by the angle within ±30 degrees from the (111) plane.

15. The method for producing the optical element according to claim 12, wherein crystal of the lanthanum fluoride film is grown in C-axis orientation on the underlayer.

16. The method for producing the optical element according to claim 12, wherein the lanthanum fluoride film is formed by a resistance heating type vacuum deposition method.

* * * * *

UNITED STATES PATENT AND TRADEMARK OFFICE
CERTIFICATE OF CORRECTION

PATENT NO. : 6,809,876 B2
DATED : October 26, 2004
INVENTOR(S) : Yusuke Taki

It is certified that error appears in the above-identified patent and that said Letters Patent is hereby corrected as shown below:

Title page,
Item [30], to read as follows:
-- [30]    Foreign Application Priority Data
   Jul. 18, 2001        (JP) ………………….. 2001-218045 --

Signed and Sealed this

Twenty-sixth Day of April, 2005

JON W. DUDAS
*Director of the United States Patent and Trademark Office*